(12) United States Patent
Parker et al.

(10) Patent No.: US 6,772,077 B1
(45) Date of Patent: *Aug. 3, 2004

(54) ELECTRIC ARC MONITORING SYSTEMS

(75) Inventors: Michael T. Parker, Camarillo, CA (US); Howard M. Ham, Jr., deceased, late of Santa Ynez, CA (US); by Lillian Margaret Ham, legal representative, Fresno, CA (US); James J. Keenan, Santa Barbara, CA (US); Luc P. Benoit, deceased, late of La Canada, CA (US), by Lislotte Benoit, legal representative

(73) Assignee: Hendry Mechanical Works, Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/762,562

(22) PCT Filed: Aug. 10, 1998

(86) PCT No.: PCT/US98/16521

§ 371 (c)(1),
(2), (4) Date: Feb. 13, 2002

(87) PCT Pub. No.: WO99/09422

PCT Pub. Date: Feb. 25, 1999

(51) Int. Cl.[7] .................................................. H02H 3/10
(52) U.S. Cl. ......................................... 702/76; 361/63
(58) Field of Search ........................... 702/76, 2, 3, 56, 702/57, 58, 75, 182, 183, 185; 324/536, 520, 613, 614, 424, 521, 522, 541, 544, 546, 547, 127; 361/42, 40, 1.13, 44, 45, 62, 63, 46–50, 43, 6, 65, 78–80, 87, 89, 93.1, 94, 111, 119, 115, 2, 5; 340/649, 650, 658, 659, 664, 635, 638, 647; 335/18, 201; 244/53 R, 60

(56) References Cited

U.S. PATENT DOCUMENTS 3,622,872 A * 11/1971 Boaz ........................... 324/536
3,707,673 A * 12/1972 Carter ......................... 324/547
3,857,066 A    12/1974 Cline et al. ................. 317/2 R (List continued on next page.)

FOREIGN PATENT DOCUMENTS

| CA | 2093420 | 10/1990 |
|---|---|---|
| EP | 0317948 A2 | 11/1988 |
| EP | 0507782 B1 | 10/1990 |
| WO | WO 90/04278 | 4/1990 |
| WO | WO 92/08143 | 5/1992 |

OTHER PUBLICATIONS

*Fractals, Chaos, Power Laws*, Manfred Schroeder, W. H. Freeman and Company, 1991, Chapter 9, p. 196–197, p.215–216.

*Fractal Geometry*, Kenneth Falconer, John Wiley & Sons, p. 270–273.

Primary Examiner—Marc S. Hoff
Assistant Examiner—Edward Raymond
(74) Attorney, Agent, or Firm—Koppel, Jacobs, Patrick & Heybl

(57) ABSTRACT

Electric arc monitoring is effected by exploiting the discovery that electric arcs are fractal phenomena in that all essential information that signifies "arc" is contained in each fractal subset. These fractal subsets are logarithmically distributed over the arc spectrum. Monitoring of arcs is most advantageously effected on a fractal subset (16) of low logarithmic order where the amplitude is higher pursuant to the 1/f characteristic of electric arcs, where cross-induction among neighboring circuit is lower, and where travel between the arc (12) and the arc signature pickup (23) is longer than at the high frequencies customary for electric arc detection. Fractal subset transformation (17) reduces the danger of false alarms. Arc signature portions may be processed in out of phase paths (242, 342) or treated as modulated carriers (42) for monitoring. Aircraft may be equipped with spark monitoring systems (80) that record (82–86) occurence of dangerous sparking at different locations (92–96) aboard the aircraft (81).

65 Claims, 6 Drawing Sheets

U.S. PATENT DOCUMENTS

| | | | | |
|---|---|---|---|---|
| 4,006,410 A | * | 2/1977 | Roberts | 324/520 |
| 4,262,254 A | | 4/1981 | Poss | 324/457 |
| 4,323,946 A | | 4/1982 | Traux | 361/218 |
| 5,099,438 A | * | 3/1992 | Gulden et al. | 700/274 |
| 5,185,684 A | | 2/1993 | Beihoff et al. | 361/45 |
| 5,185,685 A | | 2/1993 | Tennies et al. | 361/45 |
| 5,185,686 A | | 2/1993 | Hansen et al. | 361/45 |
| 5,185,687 A | | 2/1993 | Beihoff et al. | 361/45 |
| 5,206,596 A | | 4/1993 | Beihoff et al. | 324/536 |
| 5,208,542 A | | 5/1993 | Tennies et al. | 324/544 |
| 5,353,233 A | | 10/1994 | Oian et al. | 364/485 |
| 5,373,241 A | | 12/1994 | Ham, Jr. et al. | 324/536 |
| 5,434,509 A | * | 7/1995 | Blades | 324/536 |
| 5,477,150 A | | 12/1995 | Ham, Jr. et al. | 324/536 |
| 5,578,931 A | | 11/1996 | Russell et al. | 324/536 |
| 5,729,145 A | * | 3/1998 | Blades | 324/536 |
| 5,804,726 A | | 9/1998 | Geib et al. | 73/593 |
| 6,362,629 B1 | * | 3/2002 | Parker et al. | 324/536 |
| 6,594,125 B2 | * | 7/2003 | Dollar, II | 361/7 |
| 6,625,550 B1 | * | 9/2003 | Scott et al. | 702/58 |

* cited by examiner

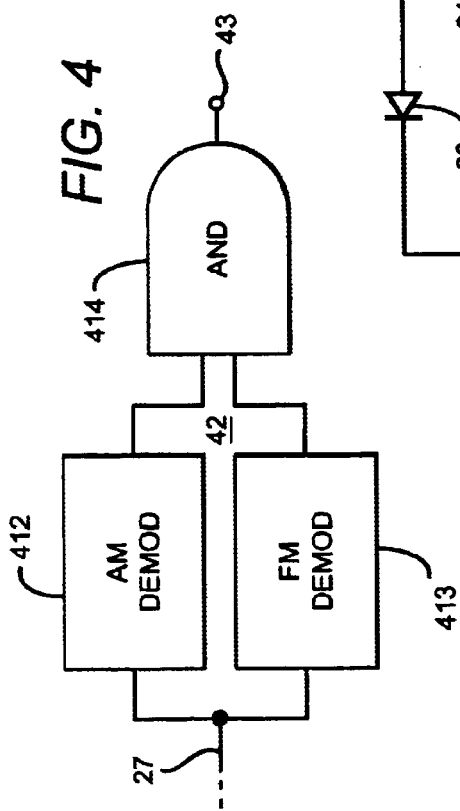
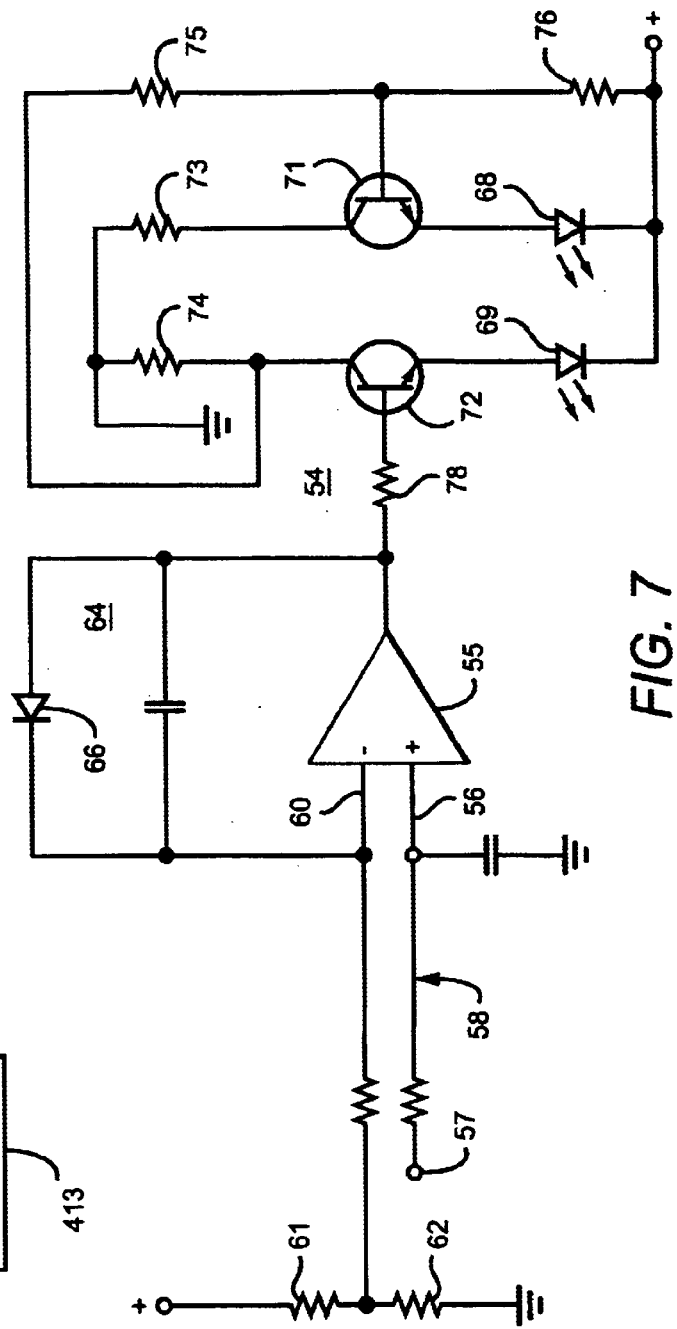
FIG. 4
FIG. 7

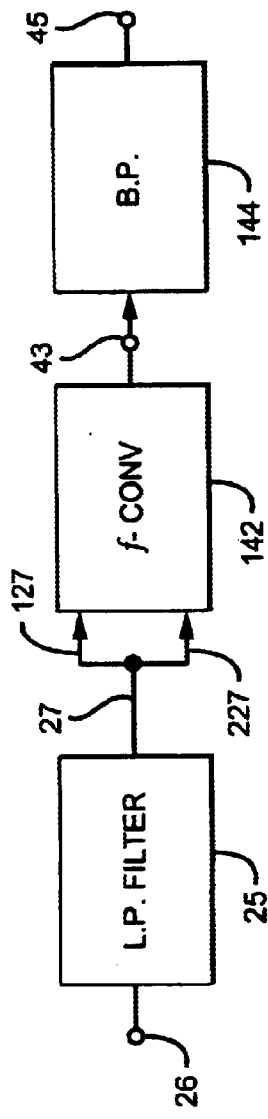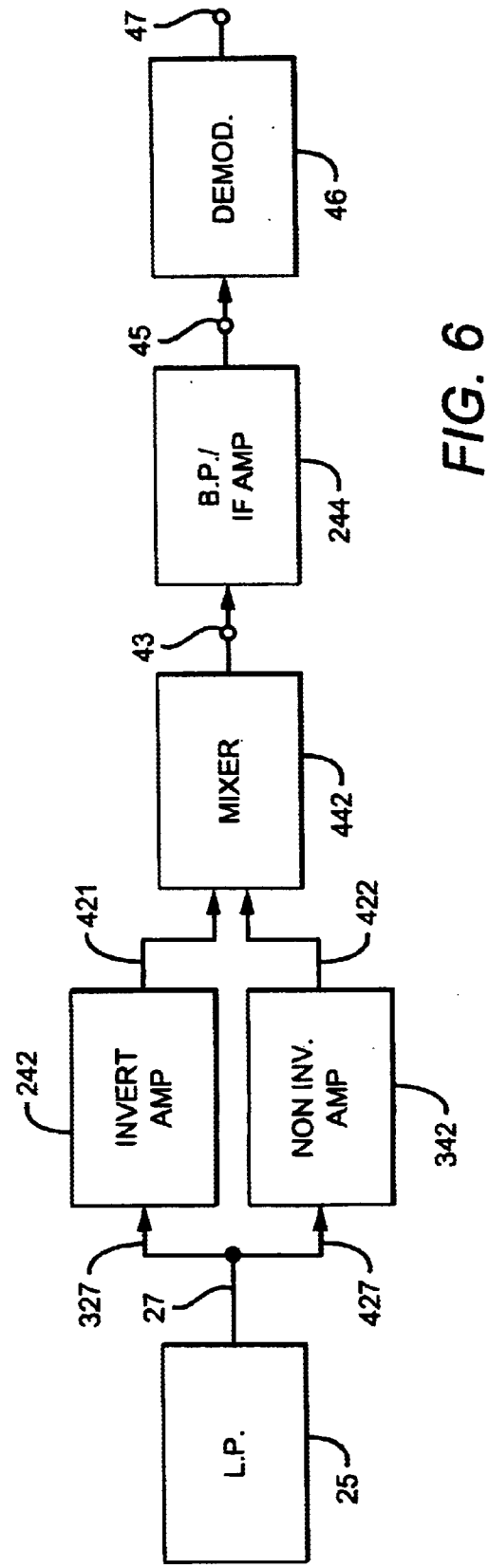

ELECTRIC ARC MONITORING SYSTEMS

CROSS-REFERENCE

This International application claims priority from its commonly owned parent application, the International Application No. PCT/US97/14497, filed 14 Aug. 1997, and having the same inventorship.

TECHNICAL FIELD

The technical field of the invention includes methods and apparatus for monitoring, detecting, indicating, evaluating and signaling electric arcs or sparks.

BACKGROUND

The chaotic electromagnetic emanations manifesting themselves as electric arcs or sparks are closely Linked to matter, wherein electromagnetic interactions bind electrons to nuclei in atoms and molecules and wherein the fundamental unit of electromagnetic radiation is the photon.

Indeed, spectra of electric arcs and sparks extend practically from DC through the entire radio-frequency spectrum and through microwave, infrared and light spectra.

Useful exploitations of the electric arc and spark phenomenon include the electric arc lamp, electric welding, the electric-arc-type of metallurgical furnace, the arc type of ion generator in satellite thrusters and for propulsion in outer space, the spark-plug-type of ignition in internal combustion engines, and electric spark ignition in gas appliances.

Unfortunately, the same quality of the electric arc or spark that led to electric lighting, electric arc welding and metallurgy, and ignition of internal combustion, has catastrophic effects in electrical faults that cause explosions or devastating fires through chaotic arcing or sparking.

A tragic example of this is seen in TWA flight 800 which on 17 Jul. 1996 exploded over the Atlantic Ocean shortly after taking off from John F. Kennedy Airport. That disaster, including its loss of all 230 persons aboard, sparked the most extensive governmental investigation in the history of aviation. As a result, it became known that the disaster started as a fuel/air explosion in the almost empty center fuel tank. After theories of sabotage were discounted, the most likely cause turned up as electric sparking or arcing in the fuel system. Indeed, such kind of sparking or its potential were found on other aircraft which thereupon were grounded for repair.

Conventional electric arc monitoring would, however, appear to be of little use in this respect, inasmuch as it manifestly is too late to recall an aircraft when an arc has sparked an explosion in the fuel system. In consequence, more is needed, or a different approach is required, than what the prior art suggests in terms of arc detection in aircraft electric current distribution systems in U.S. Pat. No. 5,185,684 by Beihoff et al., U.S. Pat. No. 5,185,685 by Tennies et al., U.S. Pat. No. 5,185,686 by Hansen et al., U.S. Pat. No. 5,185,687 by Beihoff et al., U.S. Pat. No. 5,206,596 by Beihoff et al., and U.S. Pat. No. 5,208,542 by Tennies et al., all issued to Eaton Corporation.

Electric arc detection aboard aircraft is also encumbered by the kind of electrostatic charge phenomena mentioned in U.S. Pat. No. 3,857,066, by Cline et al., issued to Dayton Aircraft Products, and disclosing electrostatic sensing probes, U.S. Pat. No. 4,262,254, by Eliasz Poss, issued to United Technologies Corporation, and disclosing a balanced corona electrostatic field sensor, and U.S. Pat. No. 4,323,946, by Robert L. Traux, disclosing techniques for reducing electrostatic charge storage.

By way of further example, electric arc monitors would be useful in garages, automobile or motorcar repair facilities, gasoline (British "petrol") storage or dispensing facilities and in other areas where accidental electric arcing can cause disastrous explosions.

Moreover, fuses and circuit breakers are capable of preventing serious overload conditions, but they are generally ineffective to prevent electrical fires and other damage from accidental arcs and sparks which typically generate enough heat for a fire at electric current levels below the level at which the fuse will blow or the circuit breaker will trip. Reliable arc monitoring would thus be highly desirable in a large number and variety of electrical circuits.

These are, of course, only representative examples of fields where reliable arc or spark monitoring could be useful.

A major stagnating problem in this respect has been that prior-art development has run its course in its fear of false alarms. Of course, false alarms are the bane of alarm systems, as frequent occurrence of false alarms can nullify the utility of any alarm system.

Accordingly, in an effort to reduce the possibility of false alarms arising from radio broadcast and radio frequency security system signals, the arc detection system as disclosed in the International Patent Publication WO90/04278, by HAMPSHIRE, Michael John, rejects frequencies below about 160 kHz and above some 180 kHz of the arc signal signature, leaving for electrical fault detection only a narrow 20 kHz band at some 170 kHz center frequency. This, however, left a sample for arc detection that was dozens of times too small in the 100 kHz range for reliably detecting the occurrence of an arc signature while at the same time preventing the occurrence of false alarms equally reliably.

An arc detection system which avoids that drawback is apparent from PCT/US90/06113, filed 24 Oct. 1990 and published as WO92/08143, by Hendry Mechanical Works, inventors HAM, Jr., Howard M., and KEENAN, James J., and in its corresponding U.S. Pat. No. 5,373,241, issued 13 Dec. 1994, and U.S. Pat. No. 5,477,150, issued 19 Dec. 1995, all herewith incorporated by reference herein for the United States of America and for all other countries where incorporation by reference is permitted. Reference should also be had to their corresponding EPO 507 782 (90917578.8) and resulting European national patents, and to their corresponding Australian Patent 656128, Canadian Patent Application 2,093,420, Chinese Patent Application 92102453.3, Japanese Patent Application 500428/91, Korean Patent Application (PCT) 701219/93, and Mexican Patent 178914 (9201530), all herewith incorporated by reference herein for all countries where incorporation by reference is permitted. That system avoids false alarms by converting instantaneous arc signature frequencies into a combination frequency from which arc-indicative signals are detected in contradistinction to extraneous narrow-band signals that could cause false alarms.

Against this background, a frequency selective arc detection system of a subsequently filed prior-art application, appears as a typical representative of the prior-art approach to arc detection. It accordingly presents a variety of approaches to arc detection that mainly look at frequencies in the upper kilohertz range, such as from 100 kHz to one megahertz. This, however, covers not only major portions of the public A.M. radio broadcast band, also known as "long-wave" and "medium-wave" broadcast bands in some countries, but also the kind of control or security systems radio frequency band referred to in the above mentioned WO90/04278 reference. Depending on location, one thus had to contend with dozens of extraneous signal interferences.

The same in essence applies to another embodiment in that prior-art proposal that suggests using a comb filter arrangement composed of four bandpass filters each of which has a 50 kHz passband, and three of which have a center frequency of 225 kHz, 525 kHz, and 825 kHz, respectively. In the A.M. broadcast and above mentioned control and security systems radio frequency band portion of that spectrum, 50 kHz samples can only represent minor fragments of the chaotic arc signature, raising the danger of false alarms from coincidental extraneous signals. This also affects the efficacy of the 55 kHz bandpass filter in that comb filter arrangement, inasmuch as that prior-art proposal continuously rotates its detection process among the four filter components of that comb filter arrangement.

A prior effort at arc detection that ventured into low frequency regions effected monitoring in various low frequency bands that were too narrow for reliable arc detection as apparent from U.S. Pat. No. 5,578,931 and articles by B. D. Russell et al., entitled "An Arcing Fault Detection Technique Using Low Frequency Current Components—Performance Evaluation Using Recorded Field Data" and "Behaviour of Low Frequency Spectra During Arcing Fault and Switching Events" (IEEE Transactions on Power Delivery, Vol. 3, No. 4, October 1988, pp. 1485–1500) indicating lack of success.

These developments in retrospect appear largely as a reaction to the perception of electric arcs as highly random phenomena borne out of the chaotic nature of arc signatures. This prior-art perception, however, ignores the fact that chaotic systems have a deterministic quality, and can be successfully dealt with, if one is able to discover what the underlying principles are and how they can be put to effective use.

Indeed, even chaotic electric lightning displays some self-similarity among its arboresque nocturnal discharges and within the branched configuration of its lightning bolts.

In this respect, pioneering work done by Benjamin Franklin and by Georg Christoph Lichtenberg back in the 18th Century casts a long shadow all the way to the subject invention.

In particular, Franklin through his famous kite experiment in a thunderstorm proved that lightning is an electrical phenomenon. Lichtenberg thereafter created his famous "Lichtenberg figures" in 1777 by dusting fine powder, such as sulfur, over insulating surfaces over which electrical discharges had taken place. Many of these Lichtenberg figures of electrical discharge resemble lightning in appearance and otherwise display a striking self-similarity in their patterns of branching lines and within such branching lines themselves. Manfred Schroeder compared this to diffusion-limited aggregation (DLA) in his book entitled "FRACTALS, CHAOS, POWER LAWS" (W. H. Freeman and Company, 1991), pp. 196, 197, 215 and 216. Kenneth Falconer, in his book entitled "FRACTAL GEOMETRY" (John Wiley & Sons, 1990), pp. 270 to 273, also applied the DLA model to electrical discharges in gas.

By way of background, fractals are phenomena in the fractal geometry conceived, named and first explained by Benoit Mandelbrot in 1975. Fractal geometry in effect is a manifestation of the fact that the natural world does not conform to an Euclidean type of geometry. Euclidean geometry is based on characteristic sizes and scaling. The natural world is not limited to specific size or scaling. Euclidean geometry suits man-made objects, but cannot realistically express natural configurations. Euclidean geometry is described by formulas, whereas the mathematical language of natural phenomena is recursive algorithms.

Such recursiveness is an expression of nature throughout destructive if not chaotic influences, manifesting itself, for instance, in a persistent invariance against changes in size and scaling, generating almost endless, repetitious patterns of self-similarity or self-affinity. Fractals are self-similar in that each of various small portions of a fractal represents a miniature replica of the whole. Such small portions are herein called "fractal subsets". This is the way nature works, and the electric arc or spark is no exception to that intrinsic principle.

Electric arc or spark monitoring generally addresses itself to so-called arc signatures which are part of the electromagnetic spectrum of arcs or sparks situated in frequency bands way below light, heat radiation and microwave spectra.

Problems in this area include false alarms from mutual induction among neighboring monitored circuits. In this respect, reference may be had to a standard equation for mutual induction, such as between a monitored circuit in which an arc is occurring, and a neighboring monitored circuit in which no arc is occurring at the time:

$$I_n = 2\pi f M I_{as}/Z_n \quad (1)$$

wherein: $I_{as}$=arc signature current flowing in the monitored circuit where an electric arc occurs at the moment, $I_n$=current induced by the arc signature in a monitored neighboring circuit where no arc has occurred at the moment, M=mutual inductance, $Z_n$=impedance of said neighboring circuit, and f=frequency.

As between neighboring circuits, the current $I_n$ induced in a neighboring monitored circuit by current $I_{as}$ flowing in the monitored circuit where an arc is occurring, decreases with decreasing frequency of that primary current $I_{as}$. However, electromagnetic arc signatures are characterized by a special shape approximating an inverse frequency (1/f) progression of their amplitude. If this is put into the above Equation (1) one gets $$I_n = (2\pi f M I_{as}/f)/Z_n \quad (2)$$

in which "f" would cancel out, so that one gets $$I_n = 2\pi M I_{as}/Z_n \quad (3)$$

that is, a mutual inductance and a secondary current, $I_n$, that are independent of frequency. Such considerations have led to the prior-art conclusion that lowering the frequency of arc signature bands in which arcs are monitored would not effectively reduce cross-induction and false arc alarms therefrom.

SUMMARY OF INVENTION

It is a general object of the invention to provide improved electric arc monitoring systems that employ novel circuitry and/or take advantage of properties of electric arc signatures not heretofore utilized.

It is a related object of embodiments of the invention to permit reliable arc monitoring at distances from electric arcs longer and with less cross-talk or induction than heretofore.

It is a germane object of aspects of the invention to exploit and to utilize the discovery herein expounded that the electric spark or arc is a totally holistic phenomenon of a fractal nature over its entire electromagnetic spectrum extending from extremely low frequencies [ELF] through the radio frequency band to its visible manifestations, including the previously mentioned branched nocturnal and other visible discharges, and discharge patterns including those manifested in the above mentioned "Lichtenberg figures".

In this respect an aspect of the subject invention accordingly exploits the discovery that electric arcs are fractal phenomena not only in the visible luminous portion of their electromagnetic radiation, as heretofore thought, but in fact are fractal phenomena all the way down to the extremely low frequency band of their electromagnetic emanation into space or along wires of the circuit where the particular arc occurs. Since all essential information that signifies "arc" is thus contained in each fractal subset, it is sufficient for arc monitoring purposes to monitor a fractal subset of the arc's electromagnetic emanation.

Expressions such as "monitor" and "monitoring" are herein used in a broad sense, including monitoring, detecting, indicating, evaluating and/or signaling electric arcs or sparks, whereas the word "arc" is herein used generically to cover electric arcs and sparks interchangeably as being essentially the same phenomenon, except where otherwise noted herein.

The realization according to the subject invention that the fractal nature of the arc is not limited to its visible region, but in fact extends all the way down to a few cycles per second of its signature, adds to the previously known characteristics of electric arcs at least one fundamental characteristic and at least one criterion; namely, that:

1. All essential information for effective electric arc monitoring is contained in any fractal subset of the arc signature; whereby
2. the selection of the monitoring frequency band for each purpose is liberated from prior-art constraints and can truly be the result of an optimum tradeoff in sensitivity, speed of detection, prevention or rejection of false signals, desired length of travel and mode of transmission of the arc signature from the arc to the monitoring circuit in different environments.

Pursuant to these principles, the subject invention resides in a system of monitoring an electric arc having an arc signature typified by a wideband range of frequencies of a chaotic nature in a monitored circuit, and, more specifically, resides in selecting a fractal subset of the arc signature characterized by relatively long travel along the monitored circuit, and monitoring that fractal subset of the arc signature.

The expression "relatively" in this context refers to the fact that the length of possible travel of the arc signal is inversely proportional to the frequency of the arc signature. In this respect, reference may be had to the familiar algebraic equation for electric current:

$$I = E/[R^2 + (2\pi f L - 1/2\pi f C)^2]^{1/2} \quad (4)$$

wherein: I=electric current,
E=voltage or potential,
R=resistance,
f=frequency,
L=inductance, and
C=capacitance of the electric circuit.

From this equation a related benefit of an embodiment of the invention can be seen; namely, that a selection of the lowest frequency or longest wavelength fractal in effect amounts to a selection of the longest survivor of the different fractals of the arc signature traveling along the monitored circuit. Up to a point, one can say that the monitored circuit itself thus performs the function of a low-pass filter for the arc detection monitor. Accordingly, embodiments of the invention permit arc monitoring at considerable distances from the occurrence of arcs in the circuit, which is useful in practice for several reasons, including the capability of surveying large circuits, and the convenience of providing central arc detection monitoring stations for several different circuits.

At any rate, at low arc signature frequencies, the possible travel of the arc signal along the monitored circuit is long, relative to higher arc signature frequencies.

It also turns out that false alarms from mutual induction among neighboring monitored circuits is lowest at low arc signature frequencies, quite contrary to what the prior art would have indicated pursuant to Equations (1) to (3) set forth above, wherein the frequency factor "f" in the denominator would cancel out the "f" in the numerator in Equation (2).

However, the fallacy of that conclusion becomes apparent if certain possible radiation effects are considered. In this respect, it is well known that $\lambda/2$ and $\lambda/4$ antennas Constitute excellent Hertzian and Marconi-type electromagnetic radiators. The wiring in many telephone exchange, electric power supply and other installations in effect often forms such antennas at the kind of radio frequencies selected by the prior art for electric arc detection purposes. Even where the length of some wiring in an installation in insufficient to constitute a quarter-wavelength antenna, certain reactances in the circuit can provide the lumped-impedance kind of tuning or "loading" that renders even relatively short conductors effective radiators.

In consequence, picked-up electromagnetic arc signatures are transmitted among neighboring circuits, resulting in false alarms, unless the segment of the arc signature picked up for monitoring is of a very low frequency (VLF) according to one aspect of the invention.

Accordingly, lower frequency fractals pursuant to embodiments of the invention induce less spurious signals through cross-induction in neighboring circuits than arc signatures having higher frequencies. Low frequency fractals more effectively avoid false alarms from mutual inductance among neighboring circuits than arc signatures at higher frequencies.

In consequence, embodiments of the invention not only permit arc monitoring at considerable distances from the occurrence of arcs in a monitored circuit, but also avoid false alarms in neighboring monitored circuits.

According to a related embodiment of the invention, the electric arc is detected from a fractal subset of the arc signature at frequencies below 30 kHz. According to The New IEEE Standard Dictionary of Electrical and Electronics Terms, Fifth Edition (The Institute of Electrical and Electronics Engineers, 1993), this is the upper limit of the very low frequency (VLF) band.

A presently preferred embodiment of the invention restricts fractal subsets from which the electric arc is detected to the ELF (extremely low frequency) band which in that IEEE Standard Dictionary is defined as extending from 3 Hz to 3 kHz.

Another embodiment of the invention restricts monitored fractals to arc signature frequencies below the voice frequency band (vf) defined in that IEEE Standard Dictionary as extending from 200 Hz to 3500 Hz.

In that vein, a further embodiment of the invention restricts monitored fractal subsets to arc signature frequencies below a first harmonic of a standard line frequency in alternating-current power supply systems.

An embodiment of the invention even selects the monitored arc signature fractal subset from a frequency band on the order of a standard line frequency in alternating-current power supply systems.

According to a related aspect of the invention, an apparatus for monitoring an electric arc having an arc signature typified by a wideband range of frequencies of a chaotic nature in a monitored circuit, comprises, in combination, an electric filter having an input coupled to that arc, having a passband corresponding to a fractal subset of the arc signature characterized by relatively long travel along the monitored circuit, and having an output for that fractal subset of arc signature. Such apparatus includes a chaotic wideband signal detector having a detector input for that fractal subset of the arc signature coupled to the output of the electric filter.

From another aspect thereof, the invention resides in a method of monitoring an electric arc having an arc signature extending over a wideband range of frequencies of a chaotic nature in a monitored circuit. The invention according to this aspect resides, more specifically, in the improvement comprising, in combination, processing portions of the arc signature in two paths out of phase with each other, and monitoring the electric arc from such out of phase portions of the arc signature.

From a related aspect thereof, the invention resides in apparatus for monitoring an electric arc having an arc signature typified by a wideband range of frequencies of a chaotic nature in a monitored circuit. The invention according to this aspect resides, more specifically, in the improvement comprising, in combination, an electric filter having an input coupled to the arc, having a passband corresponding to portions of the arc signature, and having an output for such portions of arc signature, an inverting amplifier having an input connected to the output of the electric filter, and having an amplifier output, a non-inverting amplifier having an input connected to the output of the electric filter, having an amplifier output, and being in parallel to said inverting amplifier, and a chaotic wideband signal detector having a detector input coupled to the amplifier outputs of the inverting and non-inverting amplifiers.

From another aspect thereof, the invention resides in a method of monitoring an electric arc having an arc signature extending over a wideband range of frequencies of a chaotic nature in a monitored circuit, and, more specifically, resides in the improvement comprising, in combination, treating the arc signature as a modulated carrier having a modulation indicative of the electric arc, and monitoring the electric arc by monitoring a modulation of the modulated carrier.

From a related aspect thereof, the invention resides in apparatus for monitoring an electric arc having an arc signature typified by a wideband range of frequencies of a chaotic nature in a monitored circuit, and, more specifically, resides in the improvement comprising, in combination, a modulated carrier detector having an arc signature input and a carrier modulation output.

From a similar aspect thereof, the invention resides in apparatus for monitoring an electric arc having an arc signature typified by a wideband range of frequencies of a chaotic nature in a monitored circuit, and, more specifically, resides in the improvement comprising, in combination, combined modulated carrier detectors having arc signature inputs and a combined carrier modulation output.

From another aspect thereof, the invention resides in a method of monitoring occurrence of sparks aboard aircraft, comprising, in combination, continually monitoring an occurrence of sparks at a first location aboard the aircraft, continually monitoring an occurrence of sparks at a second location aboard the aircraft distant from that first location, and establishing in response to such monitoring a record of sparks occurring at the first location and a record of sparks occurring at the distant second location aboard the aircraft.

The word "spark" is used generically in this respect to cover sparks and electric arcs interchangeably, inasmuch as there may be sparking aboard aircraft that is not of an electrical origin, but that still has the potential of igniting fuel vapors and causing other damage, such as more fully disclosed below.

Accordingly, from a related aspect thereof, the invention resides in a spark monitoring system aboard aircraft, comprising, in combination, a spark monitor at a first location aboard the aircraft, having a first spark signal output, a spark monitor at a second location aboard the aircraft distant from the first location, having a second spark signal output, and a spark signal recorder connected to the first and second spark signal outputs.

BRIEF DESCRIPTION OF THE DRAWINGS

The subject invention and its various aspects and objects will become more readily apparent from the following detailed description of preferred embodiments thereof, illustrated by way of example in the accompanying drawings which also constitute a written description of the invention, wherein like reference numerals designate like or equivalent parts, and in which:

FIG. 4 is a schematic of circuitry that may be used in the system of FIG. 2 or otherwise for monitoring an arc according to an embodiment of the invention;

FIG. 5 is a schematic of another circuitry that may be used in the system of FIG. 2 or otherwise for monitoring an arc according to an embodiment of the invention;

FIG. 6 is a schematic of a further circuitry that may be used in the system of FIG. 2 or otherwise for monitoring the arc also according to an embodiment of the invention;

FIG. 7 is a circuit diagram of an optical indicator of possible or actual arcing that can be used at various stages in the systems of FIGS. 2, 4, 5 and 6, according to a further embodiment of the invention.

The accompanying FIG. 1 is copyright® as an original creation under the Berne Convention and all corresponding national laws, with Hendry Mechanical Works, of Goleta, Calif., United States of America, being the copyright proprietor which understands that this figure will be published by the World Intellectual Property Organization and thereafter by patent offices throughout the world.

MODES OF CARRYING OUT THE INVENTION

Figure 1:
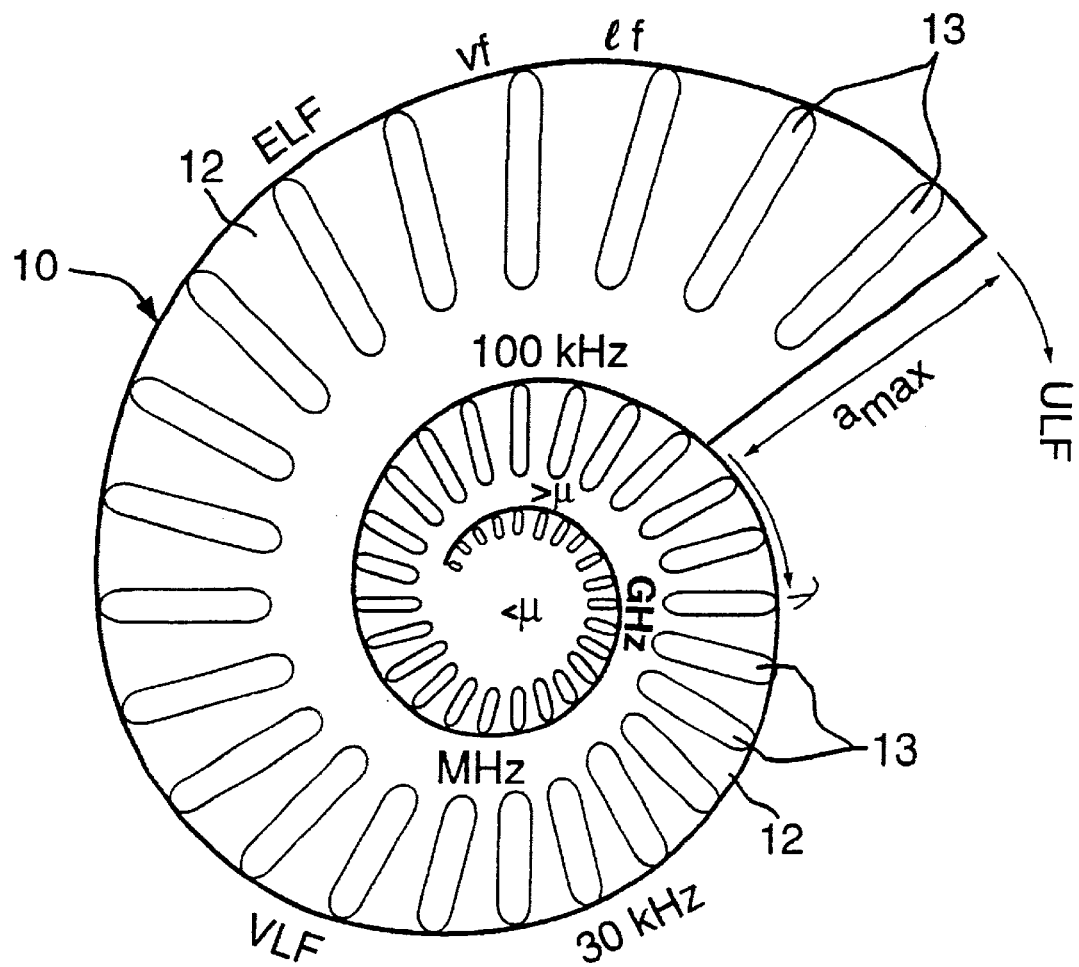
FIG. 1 is a polar coordinate representation of an electric arc signature spectrum in terms of wavelength and illustrates selection of a fractal subset for arc monitoring pursuant to an embodiment of the invention.

The drawings illustrate some basic modes and also preferred modes of carrying out an aspect of the invention. Since fractal geometry is a visual art as much as a mathematical science, FIG. 1 shows the workings of the invention in terms of a logarithmic spiral. This is a novel aspect, since arc signature spectra traditionally have been plotted in Cartesian coordinates and in terms of frequency. To a large extent, thinking and plotting in terms of frequency was justified, since the frequency of the arc signature is largely independent of the medium through which it travels, while the wavelength of the arc signature depends more directly on the traversed medium.

The traditional focus of the prior art on frequency ab initio obstructed visualization of arc signatures as a logarithmic phenomenon of fractal nature, whereas thinking and plotting in terms of wavelength according to the currently discussed aspect of the invention, leads to visualization, graphic representation and beneficial exploitation of that phenomenon.

In this vein, the polar coordinate representation of FIG. 1 arises from the basic equation $$r = \exp(q\lambda_w) \quad (5)$$

wherein: r=radius,
q=growth factor larger than 1, and
$\lambda_w$=polar angle in terms of wavelength in the particular medium, such as monitored circuit wires.

The polar coordinate plot of FIG. 1 represents a logarithmic growth spiral occurring in innumerable natural objects, including the spiral ammonite that appeared on the earth during the Devonian period which also brought forth algae and the first terestial plants some 380 million years ago. These developed in the subsequent Carboniferous period some 260 million years ago to ferns that have very pronounced fractal structures wherein each leaf structure is a miniature replica of the branch structure, and wherein each branch is a replica of the fern plant or bush. Ammonites became extinct at the end of the Cretaceous period some 65 million years ago, but ferns are very much alive along with millions of natural objects of fractal structure.

Fortunately for the insight needed in the subject invention, the area where the pioneering mathematician Jacob Bernoulli lived until 1705, had been a marine environment millions of years earlier. This provided that region with an abundance of petrified logarithmically spiraled ammonites, along with a plethora of other petrifications.

Bernoulli was so fascinated by the logarithmic spiral that he devoted his famous treaty entitled "Spira Hirabilis" (Wonderful Spiral) to the same. One of such wondrous properties is that the logarithmic spiral is the perfect fractal in that it persists through various changes. To magnification and reduction it responds elegantly by rotational displacement, thereby preserving its shape unaffected. This and other well-known properties of logarithmic spirals reveals them as truly fractal phenomena to which the electric arc signature seems akin, if viewed in polar coordinates in terms of wavelength, such as in FIG. 1.

In this respect, the ammonite shell had a chambered structure wherein internal chambers were partitioned off by septa, which were a series of spaced plates which were spaced most closely at the center of the shell and the spacing of which increased logarithmically along the growth spiral of the shell. Accordingly, the size of the chambers between adjacent septa increased logarithmically along the growth spiral.

In analogy to ammonite shell chambers, the size of frequency or wavelength intervals 12 between indicated wavelengths or frequencies 13 also increases logarithmically in terms of wavelength in the electric arc signature or spectrum 10.

The core of the electromagnetic arc emanation has been labelled as $<\mu$ at the pole of FIG. 1, indicating wavelengths of less than one micron; that is, signifying the familiar visible light emitted by the arc. In the subsequent logarithmic turn, the symbol $>\mu$ has been shown to indicate infrared radiation and microwaves that can be responsible for the utility of electric arcs in electric welding, metallurgical furnaces, and internal combustion engine ignition, and contrariwise in the sparking of explosions and startup of devastating fires by electric arcs.

Thereafter, FIG. 1 indicates specific portions of the electromagnetic arc signature in terms of frequency, including the following frequency bands with increasing progression:

GHz=gigahertz,

MHz=megahertz range wherein arc signature detection has been conducted by the prior art and wherein extraneous signals from television broadcasts and radio signals abound, 100 kHz=the one-hundred kilohertz range wherein arc signature detection also has been conducted extensively by the prior art and wherein radio broadcast signals abound, 30 kHz=a lower limit of prior-art arc detection, VLF="very low frequency" defined as extending from 3 kHz to 30 kHz by the above mentioned IEEE Dictionary.

ELF="extremely low frequency" defined as extending from 3 Hz to 3 kHz by that IEEE Dictionary, vf="voice frequency" within the range of 200 to 3500 Hz according to that IEEE Dictionary, and lf="line frequency", i.e. 50 Hz in European Systems, or 60 Hz in American systems.

Of course, no patent drawing can actually depict the chaotic nature of electric arcs. Rather, FIG. 1 as a minimum has to be viewed in terms of an instantaneous moment in the chaotic occurrence of an arc signature. Nevertheless, FIG. 1 shows the statistical self-similarity of logarithmic fractal subsets of the depicted arc signature.

Summarizing the ammonite analogy, the logarithmic nature of the depicted arc spectrum is seen not only in the evolution of the growth spiral 10, but also to the logarithmically progressing length of frequency intervals 12 in terms of wavelength, individually delimited by what corresponds to the above mentioned septa of the ammonite shell. In terms of the electric arc signature, such septa correspond to radial lines 13 denoting certain frequencies so that the intervals 12 between such frequency points are logarithmically distributed along the arc signature in terms of increasing wavelength or decreasing frequency.

FIG. 1 also depicts the inverse frequency or 1/f dependency of electric arc signatures in terms of amplitude. In the case of FIG. 1, this shows as an amplitude increasing with wavelength to a value of $a_{max}$. This is another indication of the fractal nature of electric arcs.

On the subject of 1/f-noise, Dres. rer. nat. Heinz-Otto Peitgen and Dietmar Saupe, have pointed out in their work entitled "THE SCIENCE OF FRACTAL IMAGES" (Springer-Verlag, New York, 1988) pp. 39 to 44, that there are no simple mathematical models that produce such noise, other than the tautological assumption of a specific distribution of time constants. This quite unlike to white noise on the one hand and Brownian motion on the other hand.

In this respect, they relate the discovery that almost all musical melodies mimic 1/f-noise, and they point out that both music and 1/f noise are intermediate between randomness and predictability, as fractals are intermediate between chaos and order. Indeed, music with its numerous variations on a theme is replete with fractals, and a connoisseur can reliably identify an entire symphony upon hearing only a small portion thereof. Even the smallest phrase reflects the whole. And so it is with electric arc signatures, with such smallest phrase called herein a "fractal subset", and the connoisseur being the arc detector.

As the Leitmotif in music, such fractal subset may have the nature of an attractor as a limit figure of fractal iteration, as more fully described below.

In terms of indications in FIG. 1, a preferred embodiment of the invention detects the electric arc from a fractal subset below 30 kHz of the wideband range of arc signature frequencies. This includes the above mentioned VLF (very low frequency) range and frequencies below that range.

More specifically, an embodiment of the invention restricts fractal subsets from which the electric arc is detected or in which the electric arc is monitored to the ELF (extremely low frequency) band which according to The New IEEE Standard Dictionary of Electrical and Electronics Terms, Fifth Edition (The Institute of Electrical and Electronics Engineers, 1993) is defined as extending from 3 Hz to 3 kHz.

Another embodiment of the invention restricts monitored fractals to arc signature frequencies below the voice frequency band (vf) defined in that IEEE Standard Dictionary as extending from 200 Hz to 3500 Hz. In that vein, a further embodiment of the invention restricts monitored fractal subsets to arc signature frequencies below a first harmonic of a standard line frequency in alternating-current power supply systems. An embodiment of the invention even selects the monitored arc signature fractal subset from a frequency band on the order of a standard line frequency (lf) in alternating-current power supply systems.

In this manner, the invention in its embodiments can select the fractal that will give the best overall performance in a given situation, all the way to the maximum arc signature amplitude of $a_{max}$ for optimum signal-to-noise ratio; with the signal in such case being the 1/f-noise of the arc which we have designated above as $\lambda_w$-noise. The noise in the expression "signal-to-noise ratio", on the other hand, includes white noise and Brownian noise, such as produced by the electronic circuits of the arc monitoring apparatus, and extraneous signals that could engender false alarms or readings.

Of course, depending on application, there may be goals other than reaching $a_{max}$, but as FIG. 1 depicts, arc signature amplitudes at various frequency fractals selected pursuant to the subject invention in the larger portion of the outer turn of the growth spiral 10 still are significantly better than what the prior art had to work with.

In this respect, selecting from the arc signature a fractal that yields an amplitude of $a_{max}$ or an amplitude comparable thereto according to an embodiment of the invention has another advantage where cross-induction of arc signatures could be a problem. Take for example the case where several electric circuits are monitored for electric arcs by several corresponding arc detectors, and assume that an arc occurs in one of these circuits and that the arc detector pertaining to that circuit is to respond thereto.

Pursuant to what has been said above at and after Equations (1) to (4), by selecting a high-amplitude (i.e. long-wavelength or low-frequency) fractal subset for the arc monitoring process, a preferred embodiment of the invention minimizes if not practically eliminates the prior-art danger of false alarms from cross-induction among independently monitored neighboring circuits.

Figure 2:
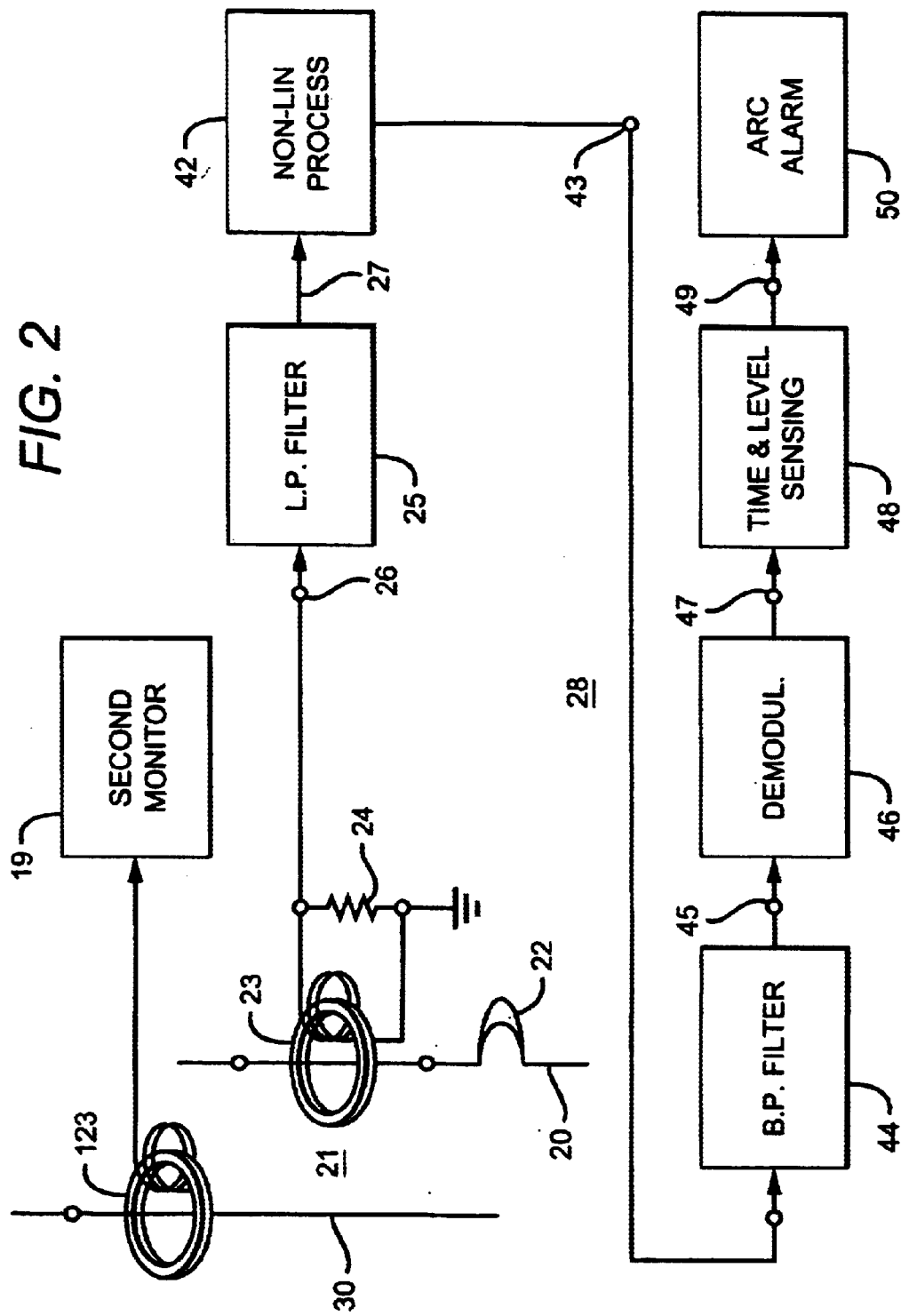
FIG. 2 is a block diagram of an electric arc monitoring system pursuant to an embodiment of the invention.

FIG. 2 shows an electric conductor 20 of electric circuitry 21 wherein an electric arc 22 occurs.

By way of example, the circuitry 21 may be part of a telephone exchange or may be another one of a large variety of electric circuits or loads, including the following examples:

In internal combustion engine research, development, and maintenance, it is important to establish and to maintain the optimum spark in each cylinder. A reliable spark monitoring system is therefore highly desirable, if not potentially indispensable in cutting-edge internal combustion engine technology.

In a similar vein, electric welding is becoming increasingly robotized and reliable monitoring of the welding arc or spark would greatly benefit research, development and assembly-line quality control and assurance in automated electric arc welding. Moreover, many modern electric spot welding processes rely on immediate application of electric energy to the work pieces to be joined, without intervention of an electric arc. In fact, the occurrence of an electric arc, such as by imperfect contact between the work pieces, degrades the resulting weld in such Joule-effect welding processes. Accordingly, the load at 21 may for instance be a robotic or other spot welding apparatus. In that case, the electric arc monitor could supervise the spot welding process and could signal when substandard welds are being produced by intervening arcing. This, in turn, would signal the need for remedial action, such as including better cleaning of work pieces prior to welding or better compression of the work pieces during welding for more intimate contact.

Also, modern descendants of the original electric arc lamp, such as mercury or sodium vapor lamps, could benefit as to research and development and in the maintenance of high-quality performance from reliable arc monitoring systems, as could electric-arc-types of metallurgical and other furnaces.

Similarly, arc and spark monitoring systems would be useful to detect and if necessary eliminate faults in electric circuitry and equipment creating radio interference through excessive sparking or arcing.

As a further example, some gas heating appliances have gaseous fuel ignitors that work with an electric spark. In such cases, it is often important to know whether the desired spark has occurred for proper ignition, especially if the thermostat is remote from the heating unit. Also, an electric spark monitor would indicate when the igniter is in need for replacement, before breakdown and costly outage occur.

Moreover, electric arcs are used in ionizers, such as ammonia arc and other ion generators that are coming into use in satellite thrusters and in propulsion systems in outer space, such as for restabilizing satellites in geostationary orbits or for propelling satellites and space probes on their journey. In such cases, an electric arc monitor would be useful in research, development, maintenance and operation of such ion generators.

Alternatively, machinery, circuitry or apparatus at 21 that produces normal sparks in its operation could be monitored for detrimental arcing. One of many examples concerns commutators of electric motors that are often damaged when their carbon brushes wear out, as the rotating commutator then rubs against the metallic brush holder springs. Since such wear is accompanied by heavy arcing, an early detection of such heavy arcing, as distinguished from regular commutator sparking, would signal the need for preventive action and could save the equipment from breakdown and severe damage. The same applies to relays and contactors that generate sparks and arcs in their normal operation, but are subject to excessive arcing in case of malfunction or excessive wear.

Similarly, the recurrence of the electric automobile as an environmentally friendlier vehicle than the gasoline-driven automobile or petrol-driven motorcar, renders reliable arc monitoring even more important. In particular, such electric vehicles carry large storage batteries that have to be recharged, typically overnight, and that generate combustible gases, such as oxygen and hydrogen, during such recharging. Electric arcing obviously could be disastrous in such an atmosphere. Accordingly, monitoring that environment for electric arcing and shutting down the charging process and giving an alarm immediately upon detection of arcing, could prevent disaster.

In all these cases, the invention selects a fractal subset 16 of the signature of the electric arc 22 for the purpose of arc detection. In such selection the invention aims for a relatively long travel of arc signature along the monitored circuit 20 (distance between arc 22 and pickup 23), and for low cross-induction among neighboring circuits, including the monitored circuit 20.

According to a preferred embodiment of the invention, the fractal subset of arc signatures is selected in a frequency band below 30 kHz, where arc signature amplitudes are higher, arc signature travel along wires (20) is longer, and arc signal cross-induction among separately monitored neighboring circuits (21, 30) is lower, than at higher frequencies.

The invention then detects the electric arc 22 from the fractal subset 16 of the arc signature. A preferred embodiment of the invention detects the electric arc 22 from a fractal subset of the arc signature below 30 kHz, such as in the ELF (extremely low frequency) band, defined above as extending from 3 Hz to 3 kHz, or even below the voice frequency band (vf) defined above as extending from 200 Hz.

Figure 3:
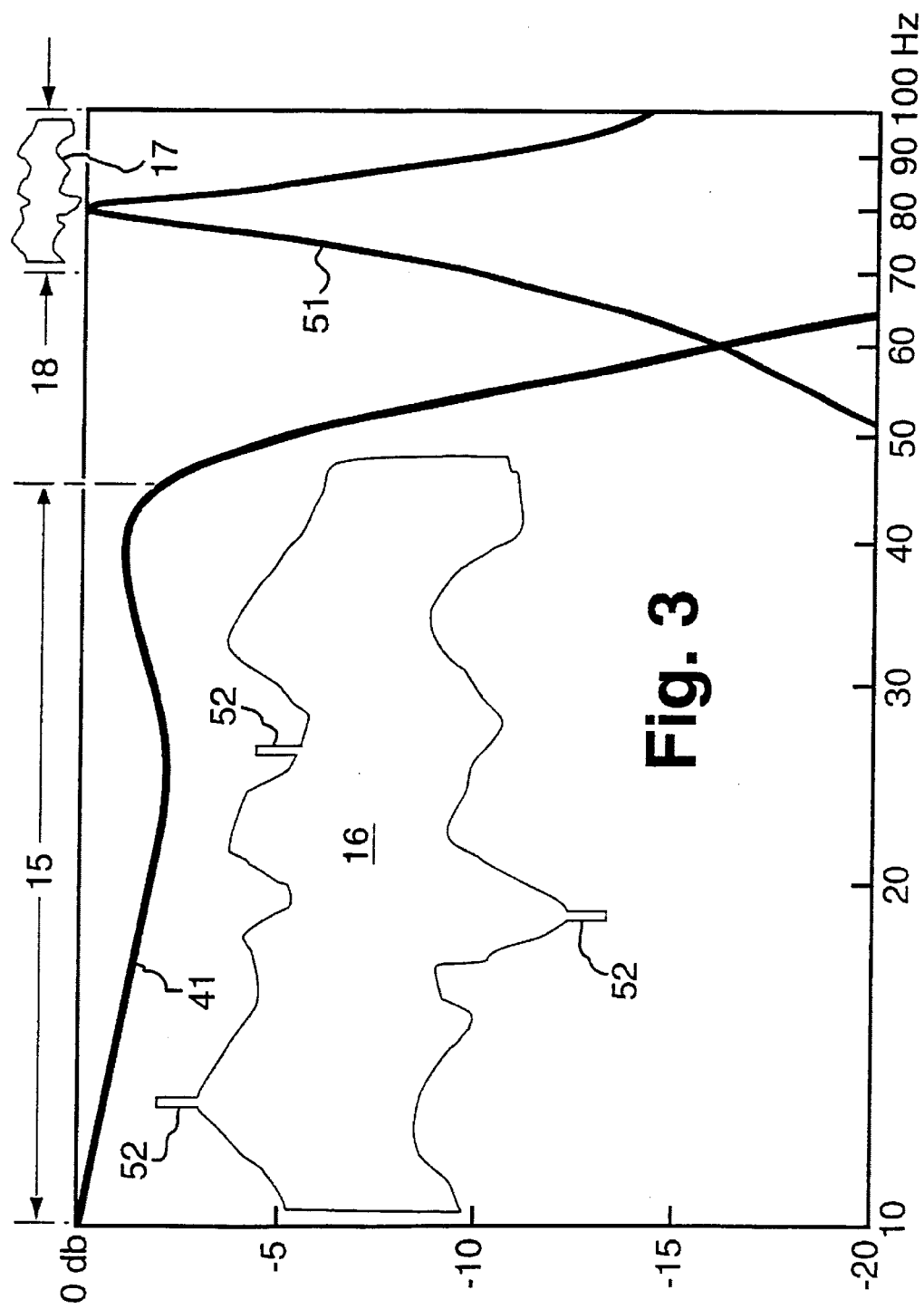
FIG. 3 shows gain vs. frequency graphs illustrating a presently preferred embodiment of the invention.

By way of example FIG. 3 shows such a fractal subset of the arc signature at 16 within a band 15 illustrated on a logarithmic scale. In practice, selection of such a low-frequency fractal subset 16 avoids false alarms by cross-induction, such as between the circuit 20 where an arc 22 does occur, and any separately monitored neighboring circuits 30, etc., wherein no arc occurs at the moment or, conversely, between any neighboring circuit where an electric arc does occur and is monitored by another monitoring circuit 19, and the circuit 20 when no arc occurs at that point.

Selection of such low-frequency fractal subset 16 also permits detection of the arc 22 from a remote location along wires 20 over longer distances than would be possible at high frequencies. Selection of such a low frequency band also yields a high amplitude input signal for the detection process according to the above mentioned 1/f or $\lambda_w$ characteristic of the arc for highest signal-to-noise ratio with lowest exposure to false alarms.

Sensitivity to switching transients in telephone exchanges, to multiplexed audio and otherwise, and to harmonics of alternating-current supply frequencies may be practically eliminated, and the permissible travel distance of arc signals between the arc 22 and the pickup 23 may be multiplied as compared to high-frequency detection systems, by selecting the narrower frequency band 15 on the order of a standard line frequency in public alternating-current power supply systems. Preferably, according to that embodiment, the selected narrower frequency band is below the first-order harmonic of that standard line frequency.

According to the embodiment illustrated with the aid of FIG. 3, the selected arc signature fractal subset may be a filter passband 15, below line frequency, such as below 50 Hz for European-type systems and below 60 Hz for American-type systems.

Accordingly, it may be said that arc monitoring according to a preferred embodiment of the invention concentrates on the low end of the arc signature spectrum.

The fractal subset of the arc signature 16 or the passband 15 from which detection of an arc 22 takes place, covers at least a quarter of a logarithmic decade of the wideband range of frequencies of the electric arc 22.

This overcomes a drawback of the prior-art approach manifestation in the above mentioned WO90/04278 that missed the point by limiting the band of detection to within some 20 kHz at some 170 kHz center frequency. This, however, left only a few percent of the arc signature information in the particular logarithmic decade available for detection, considering that a range of 20 kHz in the 170 kHz area is but a small fragment of the particular logarithmic decade that contains the information signifying "arc" as distinguished from other signals.

The situation is not much better in the case of most bandpass filter components of the comb filter disclosed in the above mentioned subsequently filed application. All but the first bandpass filter component have center frequencies belonging in effect to the fifth logarithmic decade covering from 100 kHz to one hertz less than 1 MHz. Since all these components have a 50 kHz bandwidth, they can only pass a small percentage of the arc signature information in the particular logarithmic decade for detection of an arc as distinguished from other error signals or from picked-up extraneous signals. By rotating detection among the components of its comb filter arrangement, that prior-art proposal even misses an opportunity of making best use of its lowest frequency component in the 55 kHz area.

By way of example, the invention may be practiced with the circuitry shown in FIG. 2. In that circuitry an electric arc 22 having an arc signature typified by a wideband range of frequencies of a chaotic nature, is detected with the aid of an electric filter 25 having an input 26 coupled to that arc, having a passband corresponding to a fractal subset 16 of the arc signature characterized by relatively long travel along the monitored circuit and low cross-induction among neighboring circuits, and having an output 27 of that fractal subset of arc signature. Chaotic wideband signal detector circuitry having a detector input for that fractal subset 16 of the arc signature may be coupled to that output of the electric filter, such as disclosed in the further course of FIG. 2.

The arc signature pickup 23 may be of a conventional kind, such as a clamp-on current transformer terminating into an impedance 24 that may be symbolic of a conventional peak-to-peak limiter for clipping unusually large input transients, such as with the aid of two high-speed diodes connected back to back with one side to ground and a series current limiting resistor.

The pickup or transformer 23 may for instance be wound to be sensitive to frequencies in the 25 Hz to 50 Hz range with a minimum of insertion loss. Such transformer 23 may be clamped around the line 20 to be monitored. Hall effect sensors present another example of arc signal pick-ups that may be employed in the practice of the invention, which extends to the use of other sensors of a wired or wireless type. Other monitored circuits 30, etc., may be provided with like or similar pickups 123 and monitoring circuitry 19.

The picked-up arc signature signal or fractal subset 16 is passed through a lowpass filter 25 having an input 26 connected to the arc signature pickup 13. In a prototype of this embodiment, the configuration of this filter is that of two cascaded 3rd order Butterworth filters; but other configurations and other kinds of filters may be selected within tile scope of the invention.

The gain vs. frequency plot of FIG. 3 shows a typical response characteristic 41 of such a filter, having little attenuation in the selected narrower frequency band 15.

Within the scope of the invention, the passband 15 could cover an entire logarithmic decade, such as from 10 Hz to 100 Hz. According to an embodiment of the invention the monitored arc signature fractal 16 or passband 15 covers not more than a logarithmic decade of the wideband range of frequencies of the electric arc 22, inasmuch as the decade of from D.C. to 10 Hz is rather a regular decade than a logarithmic decade.

In this respect, FIG. 3 shows only about half of a logarithmic decade for the upper portion of the filter characteristic 41 at passband 15. This demonstrably has provided reliable arc detection with the illustrated embodiment of the invention. Depending on circumstances, the fractal of arc signature 16 may be even less than as illustrated in FIG. 3, but should cover at least a quarter of a logarithmic decade of the wideband range of frequencies of the electric arc, for reliable arc detection with simultaneous exclusion of false alarms.

In principle, aspects of the invention herein disclosed can be applied to frequency bands other than the preferred ELF (extremely low frequency) band, and the subject applicants have built models of the circuitry shown in FIG. 2 not only for the ELF band, but also for operation at several kilohertz, as well as in the 10 to 20 kHz region.

According to a preferred embodiment, the narrower frequency band 15 or fractal subset 16 is selected where there are less extraneous signals than in a remainder of the wideband range of frequencies of the arc signature. In this respect, the embodiment illustrated in FIG. 3 shows the narrow frequency band 15 as covering from about 10 Hz to less than 50 Hz where there are no significant switching transients in telephone exchanges, effects of multiplexed audio signals, harmonics of alternating-current supply frequencies, signals from control or security systems and radio broadcast signals. However, not all embodiments of the invention are intended to be limited to operation within and below the very low frequency range.

According to FIG. 2, the output 27 of the filter 25 is applied to nonlinear processing in what is herein called a nonlinear processor 42. By way of example, such non-linear processor may comprise a demodulator also called "modulated carrier detector" that demodulates signals passed by the filter 25, including picked-up electric arc signature segments with chaotically varying amplitudes and frequencies. This and other aspects of the invention treat a fractal subset of the arc signature as a modulated carrier having a modulation indicative of an electric arc 22, and monitor the electric arc by monitoring one or more modulations on such modulated carrier.

Apparatus for monitoring an electric arc having an arc signature typified by a wideband range of frequencies of a chaotic nature in a monitored circuit, include a demodulator or modulated carrier detector such as in the non-linear processor 42 having an arc signature input 27 and a carrier modulation output 43.

By way of example, the fractal subset of an arc signature may be treated as an amplitude-modulated carrier, and the electric arc may then be monitored by monitoring a modulation of such amplitude-modulated carrier, such as by recovering the modulation on such amplitude-modulated carrier, and by then detecting the amplitude from such recovered modulation.

Accordingly, the non-linear processor 42 may be an AM detector or demodulator that in response to chaotically varying amplitudes at 27 produces an AC signal at 43 as a function of such chaotically varying amplitudes. More steady signals erroneously picked up by the circuitry 23 to 27, on the other hand, produce no such AC signal. The non-linear processor 42 thus is a first stage that distinguishes picked-up arc signatures from signals stemming from radio or television broadcasts, radio frequency security systems or other sources except electric arcs.

The non-linear processor 42 thus in effect treats the picked-up arc signature as an amplitude-modulated or AM carrier whose modulation can be monitored by monitoring a modulation or amplitude of such monitored carrier, such as for detection of an electric arc 22. At least in the case of AM detection, such 'modulation' still includes its 'carrier'. Such carrier may be stripped from its modulation-by such means as a bandpass filter 44 connected to the output 43 of the non-linear processor or AM detector 42. By way of example, the bandpass filter 44 may comprise a 3rd order Butterworth filter, or a filter with a similar response. A preferred response of such filter in principle may follow the characteristic 41 shown in FIG. 3, except that the gain may be adjusted as desired or necessary. By way of example, the filter 44 may pass alternating-current signals of frequencies below 20 or 30 Hz and reject spikes and other fast signals that might be produced or occur within the circuitry up to that point.

The recovered modulation signifying "arc" appears at the output 45 of bandpass filter 44.

According to an embodiment of this aspect of the invention, combined modulated carrier detectors having arc signature inputs and a combined carrier modulation output may be used in monitoring electric arcs.

In this respect such combined modulated carrier detectors may be like kind modulated carrier detectors; such as both AM detectors or both FM detectors. An example of this is shown in FIG. 2 according to which like kind modulated carrier detectors are series connected.

In particular, the output 45 of bandpass filter 44 is connected to a second demodulator 46 which, for instance, may be an AM demodulator or detector for producing at its output 47 a signal level varying as a function of picked-up arc signature.

Within the scope of the invention, like-kind modulated carrier detectors may be parallel connected, such as within non-linear processor 42.

Within the broad aspect of the invention, it should be understood that other types or kinds of demodulation techniques may be used, such as those developed for frequency modulation, phase modulation or carrier-suppressed or single-sideband modulation, for example.

Accordingly, the non-linear processor 42 may, for instance, include an FM demodulator which at output 43 produces a signal in response to such chaotic variations of phase or frequency as occurring in an electric arc signature. In this respect, the combined modulated carrier detectors may include different kinds of modulated carrier detectors, such as an FM detector at 42 and an AM detector at 46 connected in series.

According to an embodiment of the currently discussed aspect of the invention, an arc signature is treated as a carrier modulated both in a first manner and in a different second manner, and its electric arc is monitored by monitoring first and second modulations of said carrier modulated both in said first manner and in said second manner.

By way of example, different kinds of modulated carrier detectors include an AM detector and an FM detector, and such AM detector and FM detector are connected in parallel.

By way of example, the non-linear processor 42 may include parallel-connected AM and FM demodulators 412 and 413 having 27 as their common input, and having individual outputs connected to an AND-element 414, such as shown in FIG. 4.

AND-element 414 only provides an output signal at 43 if both the AM demodulator 412 responds to chaotic amplitude variations of the picked-up signal at 27 and the FM demodulator 413 responds to chaotic phase or frequency variations of that signal at 27.

This, then, provides a further safeguard against false alarms from such extraneous signals as AM broadcast or control signals and FM broadcast or control signals, and assures that picked-up signals are only signified as stemming from electric arcs if they display not only the chaotic amplitude variation, but also the chaotic phase or frequency variation, that characterize electric arc signatures.

Preferably, full-wave rectification or detection is used at 42 and 46 instead of a half-wave rectification or detection, in order to improve the speed of detection. Such increased speed, in turn, permits selection of a lower frequency band, such as 15 shown in FIG. 3, where signal-to-noise ratio is at a maximum with extraneous signals 52 being at a minimum, even in the deliberately exaggerated showing of FIG. 3. In other words, selection of full-wave rectification or detection alleviates the tradeoff of lower detection speed at lower detection frequencies. The above mentioned higher and less error-affected sensitivity of detection is thus realized without objectionable delays in detection.

The arc-indicative signal resulting at an output 47 from the detection process at 46, is timed and level sensed at 48. Conventional RC-type or other timing circuitry and conventional comparator circuitry may be employed at 47 to prevent the arc detector from responding to switching transients, contact bouncing, ordinary commutator arcing and other transient, harmless arcs, such as more fully discussed herein with respect to FIG. 6. Alarm circuitry 50 thus responds only to arcs that sustain themselves for a given, dangerous period of time.

The circuitry 47 may include a conventional resettable latching arrangement for latching in an alarm condition if an arc 22 occurs and all detection criteria are met as herein described. Various control circuits may be energized at this point, such as for providing an audible alarm, a remote fire alarm, etc., or for shutting down power in the affected line 20. Since circuits of this kind are known per se, only a block 50 has been shown to signify the possible presence of such control and alarm circuits.

The embodiment of FIG. 2 elegantly avoids false alarms from extraneous signals, without narrowing the bandwidths of picked-up arc signals to significantly less than a fractal subset containing sufficient arc information. Such avoided extraneous signals for instance include television signals, radio broadcast signals, various control signals, harmonics and other signals that are relatively narrow in bandwidths as compared to the wide band of chaotic arc signals.

Some extraneous signals, such as those which are of a chaotic nature themselves, may have to be subjected to some common-mode rejection or other processing in order to avoid confusion thereof with chaotic arc signatures. Such rejection of extraneous signals elegantly comes about when picked-up signals are beat against themselves, such as in the context of the following embodiments of the invention.

In this respect, refinements pursuant to embodiments of the invention derive from the arc 22 a fractal arc signature subset 16 within a frequency band 15, and convert that fractal arc signature subset 16 to an arc signal 17 in a frequency band 18 distinct from that fractal subset or frequency band 15, such as shown in FIG. 3, and detect in that arc signal 17 a chaotic wideband characteristic typical of an electric arc. A preferred embodiment of the invention subjects the fractal subset 16 to a frequency transformation, such as shown at 17 in FIG. 3, and then detects the electric arc 22 from that fractal subset after frequency transformation. By way of example and not by way of limitation, the fractal subset 16 may be added to itself and the electric arc 22 may be detected from the fractal subset added to itself, such as in the manner disclosed in FIGS. 3 and 5.

In particular, a component 142 of the circuitry shown in FIG. 5 prevents extraneous signals that do occur in the monitored frequency band from affecting the arc detection process. According to that technique, narrow-band extraneous signals in the monitored fractal subset 16 of the arc signature are diminished in energy relative to a remainder of that fractal before detection of the electric arc from that fractal. Such component may be a frequency converter 142 that has converter inputs 127 and 227 for the arc signature fractal subset 16 coupled to an output 27 of electric filter circuitry 25, and has a converter output 43 for an arc signature segment 17 in a frequency band 18 distinct from the passband 15 of the filter circuitry 25. A chaotic wideband characteristic typical of an electric arc is then detected from such converted arc signal 17, such as with a chaotic wideband signal detector.

By way of example and not by way of limitation, the input and output terminals 26 and 45 may be the same in FIGS. 2 and 5, whereby the remainder of the circuit may be the same for FIG. 5 as in the apparatus of FIG. 2 more fully described above.

The illustrated embodiment of the invention even alleviates the inherent tradeoff of slower detection speed at lower frequencies. In particular, by converting the selected arc signal fractal subset 16 from the lower frequency band 15 to a higher frequency band 18 such as shown in FIG. 3 or higher, the currently discussed embodiment of the invention realizes the detection speed corresponding to the higher frequency band 18 for an arc signature fractal subset 16 stemming from the lower frequency band 15 where there are less extraneous signals and where cross-coupling among circuits is lower and actual travel distance of picked-up arc signals is higher than at frequencies above the band 15. At the same time, the illustrated preferred embodiment of the invention realizes for the higher detection speed associated with the higher frequency band 18 the lower cross-coupling among circuits and the longer possible travel distance along the affected line 20 that are associated with the lower frequency band 15. An arc 22 occurring in line 20 thus may be picked up from such line 20 at a considerable distance from that arc, without a release of any arc alarm condition in neighboring lines that are individually equipped with arc pickups 123 and arc monitoring circuits 19 which correspond to the circuitry of FIG. 2, 4, 5 or 6, but in which no arcs are occurring at the time.

As already indicated, the passband of the filter circuitry 25 may be located where there are less extraneous signals than in a remainder of said wideband range of frequencies. Such passband may be in the ELF (extremely low frequency) band, or even below the vf (voice frequency) band, or below a first harmonic of a standard line frequency in alternating-current power supply systems, or may even be on the order of a standard line frequency in alternating-current power supply systems, and/or may cover at least a quarter of a logarithmic decade of the wideband range of frequencies of the electric arc, so as to provide sufficient information for a reliable detection of the arc signal from that logarithmic decade.

The frequency converter 142 of FIG. 5 may constitute the non-linear processor 42 of FIG. 2. By way of example, the component 142 may include a multiplier having first and second inputs 127 and 227 connected to a single line 27 for receiving the filtered picked-up arc signal. This has the net effect of mixing the signal with itself, creating sum and difference products at its output 43. By way of example, the component 142 may be a four-quadrant multiplier of the type AD633. However, within the scope of the invention, a diode or non-linear circuit may be used for intermodulation of the selected fractal subset 16 with itself.

By way of example, FIG. 5 in effect adds the arc signature fractal subset 16 to itself in mixer 142 so as to double the frequency band 15 of that fractal subset as the distinct frequency band 18 of the arc signal 17 which may be somewhat truncated, such as by a subsequent filter 144 at the lower end at that higher band 18. That filter may be similar to the above mentioned filter 44 in the circuit of FIG. 2, but may have a narrower bandpass characteristic, such as shown at 51 in FIG. 3.

In apparatus terms, a frequency converter, such as component 142, has two converter inputs, such as 127 and 227, for the arc signature fractal subset 16 coupled to the output 27 of the electric filter circuitry 25, and has a converter output 43 of the arc signature signal in a frequency band 18 double or otherwise higher than the frequency band 15 of the arc signature fractal subset.

The component 142 in effect dilutes regular, man-made, non-chaotic signals that, if picked up and not diluted, might produce false alarms. The multiplier or similar stage 142 does more than simply double the frequencies of the input. It also beats all the frequencies occurring at one input 127 against all the frequencies occurring at the other input 227. This causes the output to display a summation of all the individual frequencies at one input added and subtracted from all the frequencies at the other input. Since both inputs contain a continuum of frequencies, the result is a very rich mix of frequencies at even higher and lower frequencies than those contained at the inputs. Because a man-made signal is usually a discrete single frequency or at worst a narrow spread of frequencies, such signal does not have the breadth of spectrum to contribute strongly to the output at 43. Such man-made signal constitutes a narrow source beating against the broader noise or arc signature continuum, and the result is a very weak component at the output.

In this manner, the relative strength of the continuum spectrum from the arc is enhanced compared to the strength of any discreet or man-made components that are passed by the limiter, such as at 24, or by the filter circuitry. This is the essence of this embodiment's ability to reject signals that would produce false alarms. However, a fluctuating carrier with no noise at the input could still be misidentified as an arc if it has sufficient strength, because even though the relative sensitivity to chaotic noise is greater than to modulated carriers, the latter can still reach the output if they are of sufficient strength, and thus can produce a level that may be mistaken as an arc.

Accordingly, the output of the converter or multiplier 142 is fed to the input of a bandpass filter 144, that may have a response characteristic 51 as shown in FIG. 3. Response characteristics of the type shown in FIG. 3 at 51 may, for instance, be realized by operational amplifier type of bandpass filters, quartz filters, LC resonance filters, and other circuitry accomplishing such kind of function.

As can be seen, the characteristic 51 displays minimal response to any fundamental frequency passed by the lowpass filter 25, such as in the band 15, and, in our example, displays response only to frequencies of the picked-up arc signature fractal subset 16 whose sum or other modulation product fails in the passband range 18 of the frequency-converted arc signature signal 17.

Bandpass filter 144 will pass only frequency components that are within a few hertz on either side of the passband, such as 80 Hz, for instance. This delivers a sample of the higher frequencies in the output of the multiplier 142 to the next stage 46. Because the passband is above the 50 Hz or other selected cutoff of the first filter 25, this stage 144 is only going to pass signals which have been boosted in the mixing process to frequencies higher than such cutoff. This in effect prevents non-chaotic signals from passing this stage.

In principle, the multiplier or stage 142 should not pass any of the original input frequencies (e.g. below 50 Hz) if there is no direct-current at either input 127 and 227, and if such multiplier or stage 142 is perfectly efficient. However, neither assumption is always correct in practice. Accordingly, use of the higher frequency passband filter 144 provides effective rejection of the unprocessed or unmixed original frequencies.

If a higher band of detection frequencies had been selected within the scope of the invention, such as a band limited between 10 and 20 kHz, as an example, an alternate choice for bandpass center frequency would be at some much lower frequency (i.e. 500 Hz.) detecting a difference component in the output 43 of multiplier 142. This would permit a much wider separation in the responses of the different filters employed in the circuitry, such as filters 25 and 144.

In either case, the frequency conversion or intermodulation at 142 greatly reduces the energy of picked-up extraneous signals 52 in the arc signature segment 16, by intensive common-mode or similar rejection.

The output 43 of the multiplier 142 represents a chaotic frequency sum or difference signal version of the picked-up and filtered chaotic arc signature fractal subset 16.

Within the scope of the invention, the component 142 may also include the above mentioned AM or FM detector or the combined AM and FM detectors 412 and 413 of FIG. 4, for instance. In such cases, the detector or detectors detect the amplitude and/or frequency or other type of modulation in the converted arc signature, such as indicated at 17, for arc monitoring purposes.

FIG. 6 shows another embodiment of the invention where the energy of extraneous signals is subjected to effective common-mode or similar rejection by pairing inverting and non-inverting amplifiers 242 and 342 with each other. By way of example, the inverting amplifier 242 has an input 327 connected to the output 27 of bandpass filter 25, and the non-inverting amplifier 342 has an input 427 connected to that output 27 of the above mentioned bandpass filter 25 through which the picked-up arc signal is processed.

The inverting amplifier 242 has an output 421 corrected to a mixer 442, and the non-inverting amplifier 342 has an output 422 connected to that mixer 442. The non-inverting amplifier 342 is in parallel to the inverting amplifier 242, such as seen in FIG. 6.

The electric filter 25 in the embodiment of FIG. 6 may be the same as the electric filter 25 in the embodiments of FIGS. 2 to 5. Such a filter may be split in two, providing between the terminal 26 a first filter for the inverting amplifier 242 and a second filter for the non-inverting amplifier 342. Filter 25 may be similarly split in or for the embodiment of FIGS. 4 and 5 to provide separate filter paths from the input terminal 26 to detectors 412 and 413 or multiplier or frequency converter inputs 127 and 227.

By way of example, the mixer 442 may be composed of conventional components, such as of two diodes interconnected in an OR-element configuration between input terminals at 421 and 422 and the previously mentioned output terminal 43. Within the scope of that embodiment, the component 442 may, however, include a modulator, such as the above mentioned modulator 142. In this respect and in general, the circuitry in FIG. 6 between the filtered arc signature portion or segment at 27 and the terminal 43 may correspond to the non-linear processor 42 shown in FIG. 2. The output of such processor 42 or 242, 342, and 442 at 43 4 may be filtered or otherwise processed at 244. For example, the circuit 244 may include a bandpass filter corresponding to the bandpass filter 4426 or 144 mentioned above with respect to 7 FIGS. 2 to 5. Alternatively or additionally, the component 244 in FIG. 6 may include a standard IF amplifier, such as the commercially available 440 Hz IF amplifier to name an example.

In method terms, the embodiment of FIG. 6 processes a fractal segment, such as shown at 16, or a higher frequency segment of the arc signature in the two paths 327 and 427 out of phase with each other, and detects the electric arc 22 from such out-of-phase segments or portions of the arc signature.

In apparatus terms, the embodiment shown in FIG. 6 has an input 327 of a first phase processor, herein called "inverting amplifier" 242 connected to the electric filter output 27 in a first signal path 327–421, and has an input 427 of a second phase processor, herein called "non-inverting amplifier" 342, connected to the electric filter output 27 in a second signal path 427–422; with such first and second phase processors being 180° or otherwise out of phase with each other.

The more the outputs 421 and 422 are out of phase with each other, the greater is the common-mode or similar rejection of extraneous narrow-band signals 52 in the embodiment of FIG. 6. The embodiments of FIGS. 2 to 5 thus share with each other a feature according to which the narrow-band extraneous signals, such as mentioned above or shown in FIG. 3 at 52 in a fractal subset 16 or other fractal of the arc signature are diminished in energy relative to a remainder of such fractal subset portion before detection of an electric arc 22 from such fractal subset.

At least in the embodiments shown in FIGS. 3 and 5, the fractal subset 16 is subjected to a frequency transformation, such as shown in FIG. 3, and an electric arc 22 is detected from such fractal subset after such frequency transformation. By way of example, a fractal subset .16 may be cross-modulated or may be added to itself, such as disclosed above with respect to FIG. 5 or as mentioned with respect to FIG. 6, and the electric arc is detected from such cross-modulated or added-to-itself fractal subset. The embodiment of FIG. 4 adds the variant of parallel different kind detection or demodulation, and the embodiment of FIG. 6 adds the variant of out-of-phase processing.

In either case, a fractal subset of the arc signature portion may be treated as a modulated carrier having a modulation indicative of any electric arc 22, and such electric arc may be detected from such modulated carrier for further rejections of extraneous signals. The demodulator system disclosed above with respect to FIG. 2 can also be used in the embodiment of FIG. 6, the terminal 47 of which may be the same as the input terminal 47 of the time and level sensing and alarm circuitry 48–50 in FIG. 2, with respect to which various systems of modulation have been mentioned above.

Of course, a wideband signal is not an arc signature unless it displays chaotic frequency changes. Accordingly, a stage including comparator 55, may be provided such as shown in FIG. 7 to detect and to display a pickup of a disturbance or signal that is not only wideband in the region of interest, but that is also chaotic in nature as an arc signature is, and that is sustained for a period of time, such as determined by the RC component 58.

FIG. 7 is a circuit diagram of an optical indicator of possible or actual arcing that can be used at various stages in the systems of FIGS. 2, 4, 5 and 6, according to a further embodiment of the invention.

By way of example, indications of the progress of the signal through arc monitoring circuitry may be accomplished with three similar functional blocks or differential indicators of which a prototype is shown in FIG. 7 at 54.

Such circuit 54 includes an operational amplifier 55 having its non-inverting input 56 connected to a circuit input 57 through a lowpass filter and RC timing component 58 to prevent response to short-term transients. The inverting input 60 of that op amp is connected to comparator level resistors 61 and 62. That op amp 55 has a feedback circuit 64 which may include a feedback capacitor or other impedance 65 and a unidirectional current conducting device, such as shown at 66, for such purposes as noise reduction, prevention of premature or excessive switching. By way of example, the op amp 55 may be of the type LM35BAN.

The indicator circuit 54 includes light-emitting diodes or LEDs 68 and 69 switched by transistors 71 and 72 biased through resistors, including series resistors 73 and 74 and a pair of resistors 75 and 76. Transistors 71 and 72 may, for instance, be of the type 2N2222.

A resistor 78 connects transistor 72 to the output of the comparator op amp 55. Transistor 71 is normally biased ON through the series-connected resistors 75 and 76. This turns ON the first LED 68 which, for instance, may be a green LED. Conversely, the second LED 69 may be a red LED. However, the second transistor 72 and thus the red LED 69 are biased off at that point.

As signals having frequencies in the monitored fractal subset or other band of interest occur at the output 43 of the non-linear processor 42 or modulator 142 or mixer 442 in the embodiments of FIGS. 2, 4 and 5, and thereby at the input 57 of the circuit 54 connected thereto, the output of the comparator 55 goes positive, turning the transistor 72 ON, and shutting the transistor 71 OFF. This turns the red LED 69 ON and turns the green LED 68 OFF, thereby indicating to an observer that frequencies in the band of interest for arc detection are occurring, such as through a disturbance that may be, but not necessarily is indicative of an electric arc 22. The gain of the circuit 54 may be adjusted to avoid sharp transitions in switching states. This helps a user gain a 'qualitative feel' for the amplitude of the signal at that point by gauging the mixture of red and green LED colors. The unidirectional current conducting device 66 may be omitted, if the circuit of FIG. 7 is so used in any of the circuits of FIGS. 2, 4, 5 and 6.

Alternatively, the terminal 57 of the display circuit 54 may be connected to the terminal 45 in FIG. 2, 5 or 6, or a duplicate of the circuit shown in FIG. 7 may be so connected to that terminal 45 and thereby to the output of the bandpass filter or IF amplifier 44, 144 or 244.

Such display stage 54 then indicates through its red LED an occurrence of wideband signals in a bandwidth of interest, such as in the monitored fractal subset; a well-known criterium of arc signatures. Gain adjustments in such circuit 54 again may give a user a 'qualitative feel' with respect to picked-up wideband signals at that point by gauging the mixture the red and green LED colors.

However, a wideband signal is not an arc signature unless it displays chaotic frequency changes. Accordingly, the circuitry shown in FIG. 7 may be used as a final display stage in the monitoring circuits shown in FIGS. 2, 4, 5 and 6. For instance, the input terminal 57 of the circuit 54 may be connected to the alarm output terminal 49 shown in FIG. 2. In fact, the circuitry of FIG. 7 from terminal 57 through op amp 55 may be used as timing circuit 58 and as comparator 55 in the above mentioned timing and level sensing circuitry 43 shown in FIG. 2.

The circuitry 54 may thus be used to detect and to display a pickup of a disturbance or signal that is not only wideband in the region of interest, but that is also chaotic in nature as an arc signature is, and that is sustained for a period of time, such as determined by the RC component 58.

As disturbances or signals at wideband frequencies in the range of interest occur and vary chaotically, the output of the comparator 55 at circuitry 48 and terminal 49 goes positive, turning ON the transistor 72, and shutting OFF the transistor 71. This turns ON the red LED 69 and turns OFF the green LED 68, thereby indicating to an observer the occurrence of an arc 22 in line 20.

The embodiment shown with the aid of FIG. 7 thus provides a prewarning of a possible electric arc; preferably in two or three stages, culminating in a display of an occurrence of a chaotic wideband signal in a bandwidth of the monitored fractal subset, or otherwise in a bandwidth of interest such as described above in connection with these FIGS. 2, 4, 5, 6 and 7.

Principles and circuitry herein disclosed may be employed in various arc monitoring functions, such as mentioned above. In the case of such uses as research, development, and maintenance in such areas as internal combustion engines or electric ignition, electric welding, and electric lighting, such as mentioned above, circuitry of the type shown in FIG. 2 may be employed up to the terminal 47, with and without circuitry of the type shown in FIGS. 4, 5 and 6. The kind of signal display stages shown in FIG. 7 and more sophisticated signal display and evaluation stages may be used in such cases.

Figure 8:
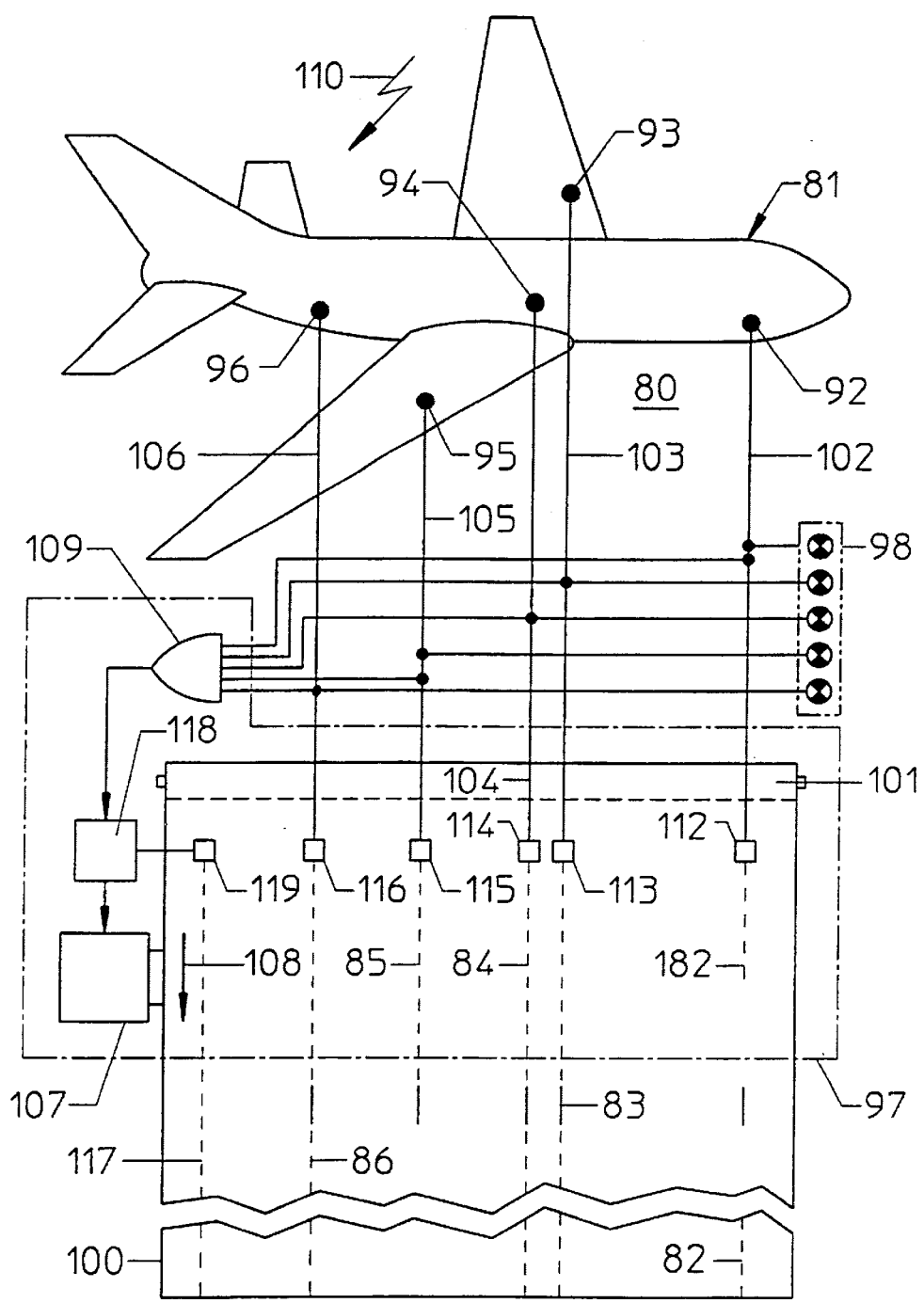
FIG. 8 is a schematic view of a spark monitoring system in and for aircraft pursuant to an embodiment of the invention.

By way of further example, FIG. 8 shows a system 80 for monitoring occurrence of sparks aboard aircraft 81, such as electric arcs of the type illustrated at 22 in FIG. 2 or sparks of the type generated by worn and other metal components.

In this respect, the Federal Aviation Administration of the United States of America in 1998 has ordered immediate inspection of the center fuel tanks of Boeing 747 jetliners after receiving reports of worn fuel line parts that could impinge so as to generate sparks which could result in fire or explosion, especially in the presence of fuel vapors. Apart from this, fire, explosion and other damage from electric arcs aboard aircraft is also possible, wherefor the expression "spark" in this context is employed generically to cover sparks and electric arcs interchangeably.

According to this aspect of the invention, the system 80 continually monitors an occurrence of sparks at a first location aboard the aircraft, continually monitors an occurrence of sparks at a second location aboard the aircraft distant from such first location, and establishes in response to such monitoring a record 82 of sparks occurring at that first location and a record 83 of sparks occurring at the distant second location aboard the aircraft 81.

In this respect, the spark monitoring system 80 aboard aircraft 81 may include a spark monitor 92 at a first location aboard the aircraft, having a first spark signal output 102, a spark monitor 93 at a second location aboard the aircraft distant from that first location, having a second spark signal output 103, and a spark signal recorder 97 connected to such first and second spark signal outputs.

For better protection, an embodiment of that aspect of the invention continually monitors an occurrence of sparks at a third location aboard the aircraft distant from the first and second locations, and establishes the desired record as a record 82 of sparks occurring at the first location, a record 83 of sparks occurring at the second location, and a record 84 of sparks occurring at the third location aboard the aircraft.

In this respect, the spark monitoring system 80 may include a spark monitor 94 at a third location aboard the aircraft distant from the first and second locations, having a third spark signal output 104 connected to the spark signal recorder 97.

The embodiment of FIG. 8 also has a spark monitor 95 at a fourth location aboard the aircraft distant from the first, second and third locations, having a fourth spark signal output 105 connected to the spark signal recorder 97, and a spark monitor 96 at a fifth location aboard the aircraft distant from the first, second, third and fourth locations, having a fifth spark signal output 106 connected to the spark signal recorder 97 of the system 80.

By way of example, the embodiment of FIG. 8 has the first spark monitor 92 in a frontal area of the aircraft 81 where an electric drive for retracting and deploying a nosewheel or where other electrical equipment may be located. FIG. 8 also shows a spark monitor 94 at the location of a central fuel tank, and spark monitors 93 and 95 at the location of integral wing fuel tanks. The embodiment of FIG. 8, moreover, has a spark monitor 96 at the location of an underfloor cargo or other freight compartment.

That much for illustrated examples of spark monitor locations. Deployment and location of spark monitors pursuant to the subject invention logically depends not only on concerns of manufacturers and operators, but also on the nature of the aircraft. Less spark monitors typically would be provided in a small aircraft than in a large airplane. Other desirable locations of spark monitors include main wheel carriage retractor positions, electric cable channels, distribution systems, and other potential sparking areas.

In fact, pursuant to a preferred embodiment of the currently disclosed aspect of the invention, the system 80 monitors occurrence of sparks at a multitude of different locations aboard the aircraft, and establishes a record of sparks occurring at such multitude of different locations aboard the aircraft 81.

According to an embodiment of the invention, an alarm condition is established in response to occurrence of sparks at at least one of the mentioned locations. Such alarm condition may be visual, audible or in any other form.

An alarm device may be connected to at least one of the spark signal outputs 102 to 106. By way of example, FIG. 8 shows a bank of signal lights 98 for signalling detection of sparks at any of the illustrated locations. Alarm conditions signalled by such lights or any other alarm conditions within the scope of the invention may be established during the flight of the aircraft.

In this respect and in general, the recorder 97 and the signalling equipment 98 may be located aboard the aircraft 81. For instance, alarm conditions may be displayed to the pilot or pilots during flight or may be established at the end of a flight of that aircraft.

In practice, it will be rare that an aircraft is recalled while in flight because of detection of sparks, unless sparking is sudden, intensive and persistent. More typically, the recorder 97 will be a so-called "black box" which in the field of aviation refers to sealed shock-proof units designed to survive an aircrash to be recoverable from the wreck for an inspection of the probable cause of the crash. Existence of such a spark detector "black box" aboard TWA Flight 800 would have gone a long way to indicate the cause of that tragedy and to make aircraft and air travel safer for the future.

While such is within the scope of the invention the main object of the invention is, however, to prevent tragedy effectively. In reality, sparking due to defective conditions will go on for weeks, if not months, before the condition has deteriorated to, or has otherwise reached the point, where an explosion or similar disaster can occur under a coincidence of peculiar circumstances including sparking as one of the factors.

Accordingly, a preferred embodiment of the invention establishes a record of occurring sparks on a chart 100 which may be processed in the spark signal recorder 97. Practice of the invention is not limited to any specific recording technique or recorder, but FIG. 8 shows a chart recorder having for instance a chart supply 101 and a chart drive 107 for driving the chart in the direction of an arrow 108.

Conventional recording devices 112, 113, 114, 115 and 116, connected to spark signal outputs 102, 103, 104, 105 and 106, respectively, may be employed for establishing records 82, 83, 84, 85 and 86, respectively, of sparks occurring at the different locations and detected by spark monitors 92, 93, 94, 95 and 96, respectively.

Whilst continuous operation of recorder 97 throughout the flight is within the scope of the invention, an embodiment thereof prefers the recorder to run only when there is at least one spark sensed at any of the locations 92, 93, 94, etc. By way of example, FIG. 8 symbolically shows a logic OR-element 109 as a device for starting the recording medium drive 107 only in response to any one or more detected sparks.

In either case, the date and time of occurrence of each sparking preferably is recorded, such as on the chart 100 itself. In this respect and in general, a timing track 117 may be provided on the chart 100. Conventional time keeping and signal generating apparatus 118 may be used for this purpose in combination with the remainder of the system, such as in conjunction with a time signal recording device 119 connected to the time signal generating apparatus 118.

The recording medium need not necessarily be a chart, but may be a magnetic, thermoplastic or other recording medium.

Spark monitoring pursuant to a preferred embodiment of the invention covers an entire flight of the aircraft 81, and the record or chart 100 is inspected after such flight. Within the scope of the invention, such monitoring covers substantially all flights of the aircraft 81 over a maintenance interval, and the record or chart 100 is made available to maintenance personnel.

In practice, an inspector or trained maintenance personnel will be able to tell the need for remedial action before a disaster occurs because of sparking. For instance, a persistent trace 84 will indicate ongoing arcing at the central fuel tank, which will call for prompt remedial action, before such sparking and accompanying conditions reach the point where an explosion or fire is possible.

By way of example, records of sparking only at the beginning and at the end of a flight, such as indicated in FIG. 8 at 82 and 182 may be due to potential malfunction of landing gear, such as from a landing wheel deployment and retraction motor that is wearing out, or from loose contacts in the electric supply, calling for prompt remedial action.

On the other hand, little can be done by way of remedial maintenance if the plane is disastrously hit by lightning. However, lightning 110 in the sky or other atmospheric electric charge concentrations can induce electric charges in the aircraft that may set off arc monitors 92 to 96 without igniting any fuel or otherwise damaging the aircraft. In such cases, all signals 98 may light up at once, or all recording devices 112 to 116 may simultaneously produce traces, such as indicated at the level of the reference numeral 83 in FIG. 8. This, then, provides a strong inference that such indicated condition is due to induced atmospheric and similar temporary phenomena, rather than to an ongoing arcing condition at any one location.

If, however, a trace occurs and persists such as shown at 85 after the atmospheric condition has subsided, then there is a strong inference that some sparking due to atmospheric conditions has affected part of the electrical equipment that ought to be looked into.

Also, continuous sparking without apparent reason, such as indicated at 84, or recurring arcing, such as indicated at 86 in FIG. 8, may indicate inadequate grounding or may signify the need for design changes. For instance, one of the problems discovered in the wake of the above mentioned disaster of TWA Flight 800 was that part of air conditioner condenser equipment was located too close to the central fuel tank. As is well known, electric arcing typically is stronger in a dry, hot atmosphere, than in a relatively humid and cool location. Accordingly, design changes should relocate hot parts of air conditioning, heat exchanger and other equipment away from fuel tanks, before a condition arises where fuel ignition is possible from sparking.

Various techniques may be employed in the practice of the currently discussed aspect of the invention, and reference may, for example, be had to the accompanying FIGS. 1 to 7 and to their description herein, such as for those of the spark detectors 92 to 96 which are electric arc detectors.

For instance, pursuant to FIG. 6, arc signatures of electric arcs picked up by any of the detectors 92 to 96 may be processed in two paths out of phase with each other, and occurrence of electric arcs may be continually monitored from such out-of-phase portions of the arc signature. In apparatus terms and pursuant to FIG. 6, an electric filter 25 having an input 26 coupled to any of the arc detectors 92 to 96 has a passband corresponding to portions of the arc signature, and has an output 27 for such portions of arc signature. An inverting amplifier 242 has an input 327 connected to the output 27 of electric filter 25, and has an amplifier output 241. A non-inverting amplifier 342 has an input 427 connected to the output 27 of electric filter 25, and has an amplifier output 422. The non-inverting amplifier is in parallel to inverting amplifier 242. A chaotic wideband signal detector 422 has a detector input coupled to amplifier outputs 421 and 422 of the inverting and non-inverting amplifiers for arc detection at 92 to 96, for instance.

Moreover, as described above with reference to FIG. 2, arc signatures of electric arcs may be treated as a modulated carrier having a modulation indicative of such electric arcs, and occurrence of these electric arcs at 92 to 96 may be continuously monitored by monitoring a modulation of such modulated carrier.

In practice, this will avoid response of arc detectors to signals other than arc signatures. Accordingly, even though many radio frequency signals occur aboard aircraft due to its normal operation, false alarms can be avoided by using techniques herein disclosed. In this respect, a preferred embodiment of the invention monitors electric arcs by monitoring a fractal subset of arc signatures of electric arcs, such as at 92 to 96 in the embodiment of FIG. 8. Application of such fractal concept permits the designer to choose the arc detection frequency band that is least likely to be affected by other frequency spectra occurring aboard aircraft 81 or otherwise. Any and all other features herein disclosed for various arc detectors and monitors may also be used in the system 80 shown in FIG. 8 and in further developments thereof within the scope of the invention.

On the other hand, non-electrically generated sparks, such as sparks resulting from mutual impingement of metallic parts of the aircraft, may be detected from spark emanations other than accompanying radio frequency spectra or "signatures".

By way of example, reference may be had to European Patent Application 87108089.1, filed 4 Jun. 1987 by BBC Brown Boveri AG, and published on 23 Dec. 1987 under Publication No. 0 249 815 and showing optoelectronic transducer systems for detecting electric arcs from their optical emanations. In this respect, optical emanations of sparks may also be detected by optoelectronic transducers located near equipment where sparking may occur. In fact, optoelectronic transducers may be employed to detect non-electrical sparks as well as electric arcs in given locations. Fiber optics may be employed in this respect between the likely location of the spark or arc and optoelectronic transducers, such as suggested in that European patent publication. The optoelectronic transducers may be connected to electronic circuitry for generating spark signal outputs in the form of electric signals, such as suggested in, or in references cited in, that European patent publication and its accompanying search report. Electric arc detectors and non-electric spark detectors may be used at different locations aboard the aircraft.

This extensive disclosure will render apparent or suggest to those skilled in the art various modifications and variations within the spirit and scope of the invention.

We claim:

1. In a method of monitoring an electric arc having an arc signature typefied by a wideband range of frequencies of a chaotic nature in a monitored circuit, the improvement comprising in combination:

selecting a fractal subset of said arc signature characterized by relatively long travel along said monitored circuit and low cross-induction among neighboring circuits; and monitoring said electric arc from said fractal subset of said arc signature.

2. A method as in a claim 1, wherein:

said fractal subset is selected from a logarithmic decade of said wideband range of frequencies.

3. A method as in claim 1, wherein:

said fraction covers at least a quarter of a logarithmic decade of said wideband range of frequencies of the electric arc.

4. A method as in claim 1, wherein:

said fractal subset is selected from a frequency band below 30 kHz.

5. A method as in claim 1, wherein:

said selection of a fractal subset is restricted in frequency to the ELF (extremely low frequency) band.

6. A method as in claim 1, wherein:

said selection of a fractal subset is restricted in frequency to below the vf (voice frequency) band.

7. A method as in claim 1, wherein:

said fractal subset is selected below a first harmonic of a standard line frequency in alternating-current power supply systems.

8. A method as in claim 1, wherein:

said fractal subset is selected from a frequency band on the order of a standard line frequency in alternating-current power supply systems.

9. A method as in claim 1, 2, 3, 4, 5, 6, 7 or 8, wherein:

narrow-band extraneous signals in said fractal subset of said arc signature are diminished in energy relative to a remainder of said fractal subset before detection of said electric arc from said fractal subset.

10. A method as in claim 1, 2, 3, 4, 5, 6, 7 or 8, wherein:

said fractal subset is subjected to a frequency transformation; and said electric arc is detected from said fractal subset after said frequency transformation.

11. A method as in claim 10, wherein:

said fractal subset is added to itself; and said electric arc is detected from the fractal subset added to itself.

12. A method as in claim 1, 2, 3, 4, 5, 6, 7 or 8, wherein:

said fractal subset is processed in two paths out of phase with each other; and said electric arc is monitored from the fractal subset processed in said two paths out of phase with each other.

13. A method as in claim 1, 2, 3, 4, 5, 6, 7 or 8, wherein:

said fractal subset is treated as a modulated carrier having a modulation indicative of said electric arc; and said electric arc is monitored by monitoring a modulation of said modulated carrier.

14. A method as in claim 13, wherein:

said fractal subset is treated as an amplitude-modulated carrier; and said electric arc is monitored by monitoring a modulation of said amplitude-modulated carrier.

15. A method as in claim 14, wherein:

said electric arc is monitored by recovering the modulation on said amplitude-modulated carrier, and by then detecting the amplitude from the recovered modulation.

16. A method as in claim 13, wherein:

said fractal subset is treated as a frequency-modulated carrier; and said electric arc is monitored by monitoring a modulation of said frequency-modulated carrier.

17. A method as in claim 13, wherein:

said fractal subset is treated as a carrier modulated both in a first manner and in a different second manner; and said electric arc is monitored by monitoring first and second modulations of said carrier modulated both in said first manner and in said second manner.

18. A method as in claim 1, 2, 3, 4, 5, 6, 7 or 8, including:

providing a prewarning of a possible electric arc.

19. A method as in claim 16, wherein:

said prewarning is provided in stages.

20. A method as in claim 1, 2, 3, 4, 5, 6, 7 or 8, including:

displaying an occurrence of signals having frequencies in a bandwidth of said fractal subset.

21. A method as in claim 1, 2, 3, 4, 5, 6, 7 or 8, including:

displaying an occurrence of wideband signals in a bandwidth of said fractal subset.

22. A method as in claim 1, 2, 3, 4, 5, 6, 7 or 8, including:

displaying an occurrence of a chaotic wideband signal in a bandwidth of said fractal subset.

23. In a method of monitoring an electric arc having an arc signature extending over a wideband range of frequencies of a chaotic nature in a monitored circuit, the improvement comprising in combination:

processing portions of said arc signature in two paths out of phase with each other; and monitoring said electric arc from said out of phase portions of said arc signature.

24. In a method of monitoring an electric arc having an arc signature extending over a wideband range of frequencies of a chaotic nature in a monitored circuit, the improvement comprising in combination:

treating said arc signature as a modulated carrier having a modulation indicative of said electric arc; and monitoring said electric arc by monitoring a modulation of said modulated carrier.

25. A method as in claim 24, wherein:

said arc signature is treated as an amplitude-modulated carrier; and said electric arc is monitored by monitoring a modulation of said amplitude-modulated carrier.

26. A method as in claim 25, wherein:

said electric arc is monitored by recovering the modulation on said amplitude-modulated carrier, and by then detecting the amplitude from the recovered modulation.

27. A method as in claim 24, wherein:

said arc signature is treated as a frequency-modulated carrier; and said electric arc is monitored by monitoring a modulation of said frequency-modulated carrier.

28. A method as in claim 24, wherein:

said arc signature is treated as a carrier modulated both in a first manner and in a different second manner; and said electric arc is monitored by monitoring first and second modulations of said carrier modulated both in said first manner and in said second manner.

29. In apparatus for monitoring an electric arc having an arc signature typified by a wideband range of frequencies of a chaotic nature in a monitored circuit, the improvement comprising in combination:

an electric filter having an input coupled to said arc, having a passband corresponding to a fractal subset of said arc signature characterized by relatively long travel along said monitored circuit and low cross-induction among neighboring circuits, and having an output for said fractal subset of arc signature; and a chaotic wideband signal detector having a detector input for said fractal subset of said arc signature coupled to said output of the electric filter.

30. Apparatus as in claim 29, wherein:

said passband is in a logarithmic decade of said wideband range of frequencies.

31. Apparatus as in claim 29, wherein:

said passband is below 30 kHz.

32. Apparatus as in claim 29, wherein:

said passband is where there are less extraneous signals than in a remainder of said wideband range of frequencies.

33. Apparatus as in claim 29, wherein:

said passband is in the ELF (extremely low frequency) band.

34. Apparatus as in claim 29, wherein:

said passband is below the vf (voice frequency) band.

35. Apparatus as in claim 29, wherein:

said passband is below a first harmonic of a standard line frequency in alternating-current power supply systems.

36. Apparatus as in claim 29, wherein:

said passband is on the order of a standard line frequency in alternating-current power supply systems.

37. Apparatus as in claim 29, wherein:

said passband covers at least a quarter of a logarithmic decade of said wideband range of frequencies of the electric arc.

38. Apparatus as in claim 29, wherein:

said passband covers not more than a logarithmic decade of said wideband range of frequencies of the electric arc.

39. Apparatus as in claim 29, including:

an inverting amplifier having an input connected to said output of said electric filter, and having an amplifier output connected to said detector input; and a non-inverting amplifier having an input connected to said output of said electric filter, and having an amplifier output connected to said detector input.

40. Apparatus as in claim 29, wherein:

said chaotic wideband signal detector includes a modulated carrier detector coupled to said output of the electric filter.

41. Apparatus as in claim 40, wherein:

said modulated carrier detector is an AM detector.

42. Apparatus as in claim 40, wherein:

said modulated carrier detector is an FM detector.

43. Apparatus as in claim 40, wherein:

said chaotic wideband detector includes combined modulated carrier detectors.

44. Apparatus as in claim 29, 30, 31, 32, 33, 34, 35, 36, 37, 38, 39, 40, 41, 42 or 43, including:

an energy converter having a converter input for said fractal subset and for narrow-band extraneous signals in said arc signature segment coupled to said output of the electric filter, and having a converter output for said arc signature segment and for narrow-band extraneous signals of diminished energy relative to the fractal subset and being connected to said chaotic wideband signal detector.

45. Apparatus as in claim 29, 30, 31, 32, 33, 34, 35, 36, 37, 38, 39, 40, 41, 42 or 43, including:

a frequency converter having a converter input for said fractal subset coupled to said output of the electric filter circuitry, and having a converter output for said fractal subset in a frequency band distinct from said passband and being connected to said chaotic wideband signal detector.

46. Apparatus as in claim 29, 30, 31, 32, 33, 34, 35, 36, 37, 38, 39, 40, 41, 42 or 43, including:

a frequency converter having two converter inputs for said fractal subset coupled to said output of the electric filter, and having a converter output for said fractal subset in a frequency band double the frequency band of said fractal subset as the distinct frequency band of said arc signal and being connected to said chaotic wideband signal detector.

47. Apparatus as in claim 29, 30, 31, 32, 33, 34, 35, 36, 37, 38, 39, 40, 41, 42 or 43, including:

a modulator having a modulator input for said fractal subset coupled to said output of the electric filter, and having a modulator output for a modulated carrier having a modulation indicative of said electric arc connected to said chaotic wideband signal detector;

said chaotic wideband signal detector including a modulation detector.

48. Apparatus as in claim 29, 30, 31, 32, 33, 34, 33, 36, 37, 38, 39, 40, 41, 42 or 43, including:
- a modulator having a modulator input for said fractal subset coupled to said output of the electric filter, and having a modulator output for an amplitude-modulated carrier having an amplitude modulation indicative of said electric arc connected to said chaotic wideband signal detector;
- said chaotic wideband signal detector including an amplitude-modulation detector.

49. Apparatus as in claim 48, wherein:
- said amplitude-modulation detector includes a first stage recovering the modulation on said amplitude-modulated carrier, and a second stage detecting from the recovered modulation an amplitude indicative of said arc signature.

50. Apparatus as in claim 29, 30, 31, 32, 33, 34, 35, 36, 37, 38, 39, 40, 41, 42 or 43, including:
- an electric arc prewarning indicator coupled to said electric filter.

51. Apparatus as in claim 29, 30, 31, 32, 33, 34, 35, 36, 37, 38, 39, 40, 41, 42 or 43, including:
- an electric arc prewarning indicator coupled to said chaotic wideband signal detector.

52. Apparatus as in claim 29, 30, 31, 32, 33, 34, 35, 36, 37, 38, 39, 40, 41, 42 or 43, including:
- a wideband signal indicator coupled to said chaotic wideband signal detector.

53. Apparatus as in claim 52, wherein:
- said indicator is a wideband chaotic signal indicator coupled to said chaotic wideband signal detector.

54. In apparatus for monitoring an electric arc having an arc signature typified by a wideband range of frequencies of a chaotic nature in a monitored circuit, the improvement comprising in combination:
- an electric filter having an input coupled to said arc, having a passband corresponding to portions of said arc signature, and having an output for said portions of arc signature;
- an inverting amplifier having an input connected to said output of said electric filter, and having an amplifier output;
- a non-inverting amplifier having an input connected to said output of said electric filter, having an amplifier output, and being in parallel to said inverting amplifier; and
- a chaotic wideband signal detector having a detector input coupled to said amplifier outputs of said inverting and non-inverting amplifiers.

55. In apparatus for monitoring an electric arc having an arc signature typified by a wideband range of frequencies of a chaotic nature in a monitored circuit, the improvement comprising in combination:
- a modulated carrier detector having an arc signature input and a carrier modulation output.

56. Apparatus as in claim 55, wherein:
- said modulated carrier detector is an AM detector.

57. Apparatus as in claim 55, wherein:
- said modulated carrier detector is an FM detector.

58. In apparatus for monitoring an electric arc having an arc signature typified by a wideband range of frequencies of a chaotic nature in a monitored circuit, the improvement comprising in combination:
- combined modulated carrier detectors having arc signature inputs and a combined carrier modulation output.

59. Apparatus as in claim 58, wherein:
- said combined modulated carrier detectors are like kind modulated carrier detectors.

60. Apparatus as in claim 59, wherein:
- said like kind modulated carrier detectors are series connected.

61. Apparatus as in claim 59, wherein:
- said like kind modulated carrier detectors are parallel connected.

62. Apparatus as in claim 58, wherein:
- said combined modulated carrier detectors include different kinds of modulated carrier detectors.

63. Apparatus as in claim 62, wherein:
- said different kinds of modulated carrier detectors include an AM detector and an FM detector.

64. Apparatus as in claim 63, wherein:
- said AM detector and FM detector are connected in parallel.

65. Apparatus as in claim 64, including:
- an AND-element having inputs connected to said AM detector and said FM detector, and having an output as said combined carrier modulation output.

* * * * *